US010159319B2

(12) United States Patent
Sirichai et al.

(10) Patent No.: US 10,159,319 B2
(45) Date of Patent: Dec. 25, 2018

(54) CASE CONSTRUCTION FOR AN ELECTRONIC DEVICE WITH FOLDING DEVICE-SUPPORT FEATURE

(71) Applicant: World Richman Manufacturing Corporation, Elgin, IL (US)

(72) Inventors: Saharut Sirichai, Bangkok (TH); Iordanka Koleva Mulhern, Milwaukee, WI (US)

(73) Assignee: WORLD RICHMAN MANUFACTURING CORPORATION, Elgin, IL (US)

( * ) Notice: Subject to any disclaimer, the term of this patent is extended or adjusted under 35 U.S.C. 154(b) by 137 days.

(21) Appl. No.: 15/290,291

(22) Filed: Oct. 11, 2016

(65) Prior Publication Data

US 2017/0099921 A1  Apr. 13, 2017

Related U.S. Application Data

(60) Provisional application No. 62/239,930, filed on Oct. 11, 2015.

(51) Int. Cl.
*B65D 85/00* (2006.01)
*A45C 11/00* (2006.01)
(Continued)

(52) U.S. Cl.
CPC ............ *A45C 11/00* (2013.01); *A45F 5/00* (2013.01); *H05K 5/0234* (2013.01);
(Continued)

(58) Field of Classification Search
CPC ............ A45C 11/00; A45C 2011/002; A45C 2011/003; A45C 2200/15; A45F 5/00; H05K 5/0234; B65D 85/00
(Continued)

(56) References Cited

U.S. PATENT DOCUMENTS 3,195,850 A * 7/1965 Steiner ................ A47B 23/043
206/45.2
8,359,078 B2  1/2013 Hung
(Continued)

*Primary Examiner* — Rafael Ortiz
(74) *Attorney, Agent, or Firm* — Christopher J. Scott

(57) ABSTRACT

A case construction selectively encases and displays an electronic device, and includes a device-retention mechanism and multi-section jacket. The device-retention mechanism removably retains the electronic device and includes an anterior device-retaining section and a posterior jacket-opposing section. The multi-section jacket includes a mechanism-backing section, a spine section, and a mechanism-covering section. The mechanism-backing section is dimensioned to cover the posterior jacket-opposing section and the mechanism-covering section is dimensioned to cover the anterior device-retaining section. The spine section pivotally connects the mechanism-covering section to the mechanism-backing section for enabling the user to selectively cover/uncover the device-retention mechanism. The mechanism-backing section and mechanism-covering section each include at least one foldable portion. The foldable portions are cooperatively foldable at the spine section for enabling the user to form a select case support footprint. The select case support footprint enables the user to selectively support the case in a select case orientation.

12 Claims, 36 Drawing Sheets

(51) Int. Cl.
*A45F 5/00* (2006.01)
*H05K 5/02* (2006.01)

(52) U.S. Cl.
CPC ... *A45C 2011/002* (2013.01); *A45C 2011/003* (2013.01); *A45C 2200/15* (2013.01)

(58) Field of Classification Search
USPC ........ 206/320, 45.2, 45.24, 45.25, 472, 477, 206/480, 45.23, 312, 387.13, 173, 156, 206/45.28
See application file for complete search history.

(56) References Cited

U.S. PATENT DOCUMENTS

| | | | |
|---|---|---|---|
| 8,640,864 B2 * | 2/2014 | Chen | G06F 1/1626 206/45.2 |
| 8,731,626 B2 | 5/2014 | Hung | |
| 8,915,357 B2 * | 12/2014 | Mecchella | A45C 11/00 206/320 |
| 9,010,529 B2 | 4/2015 | Chen et al. | |
| 9,038,979 B2 * | 5/2015 | Lu | A45C 7/0036 206/320 |
| 2013/0140203 A1 * | 6/2013 | Chiang | G06F 1/1628 206/320 |
| 2013/0213838 A1 * | 8/2013 | Tsai | G06F 1/1633 206/320 |
| 2015/0108186 A1 * | 4/2015 | Law | G03B 17/568 224/191 |
| 2015/0151871 A1 * | 6/2015 | Huang | H05K 5/0086 206/45.23 |

* cited by examiner

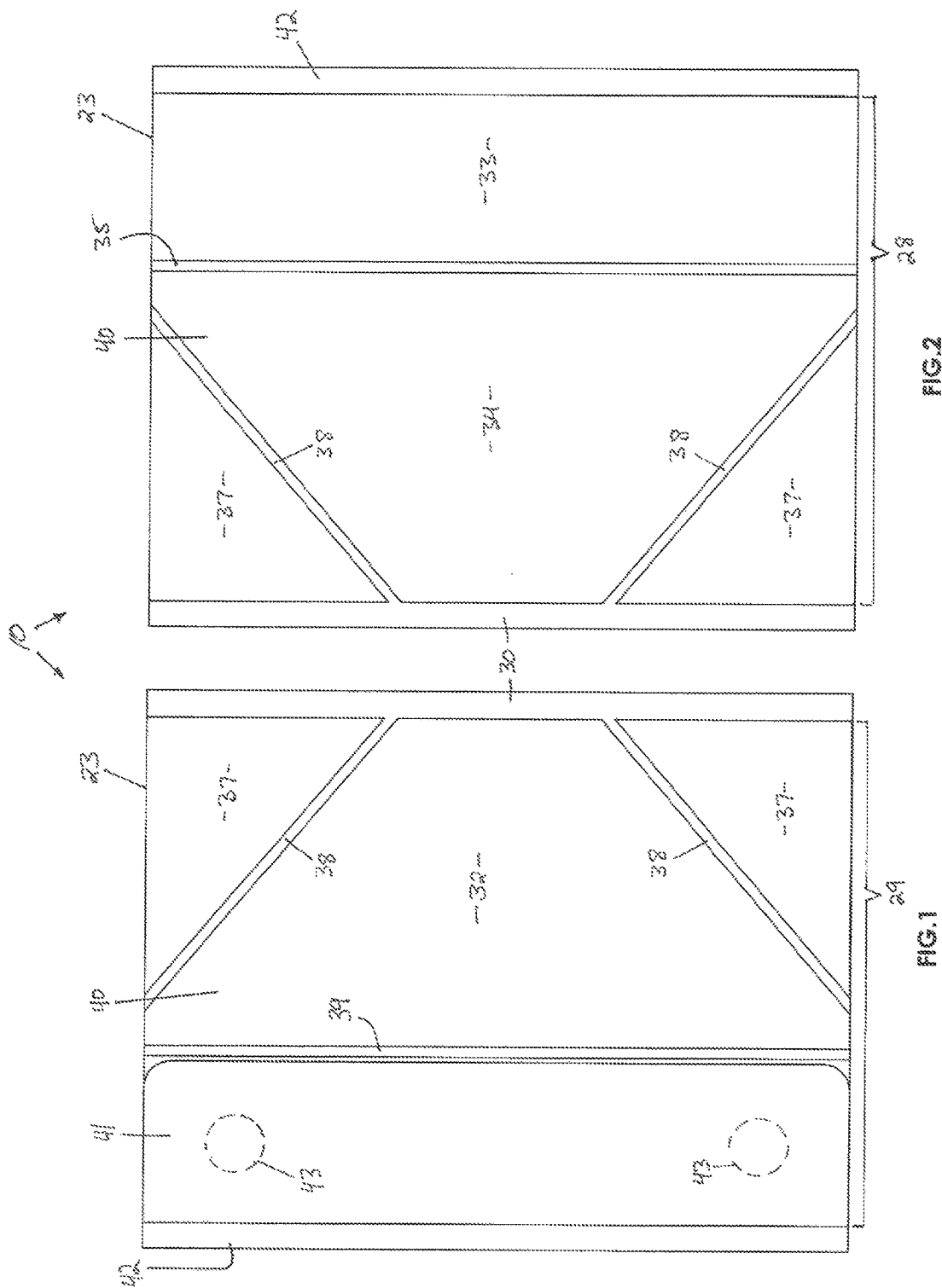

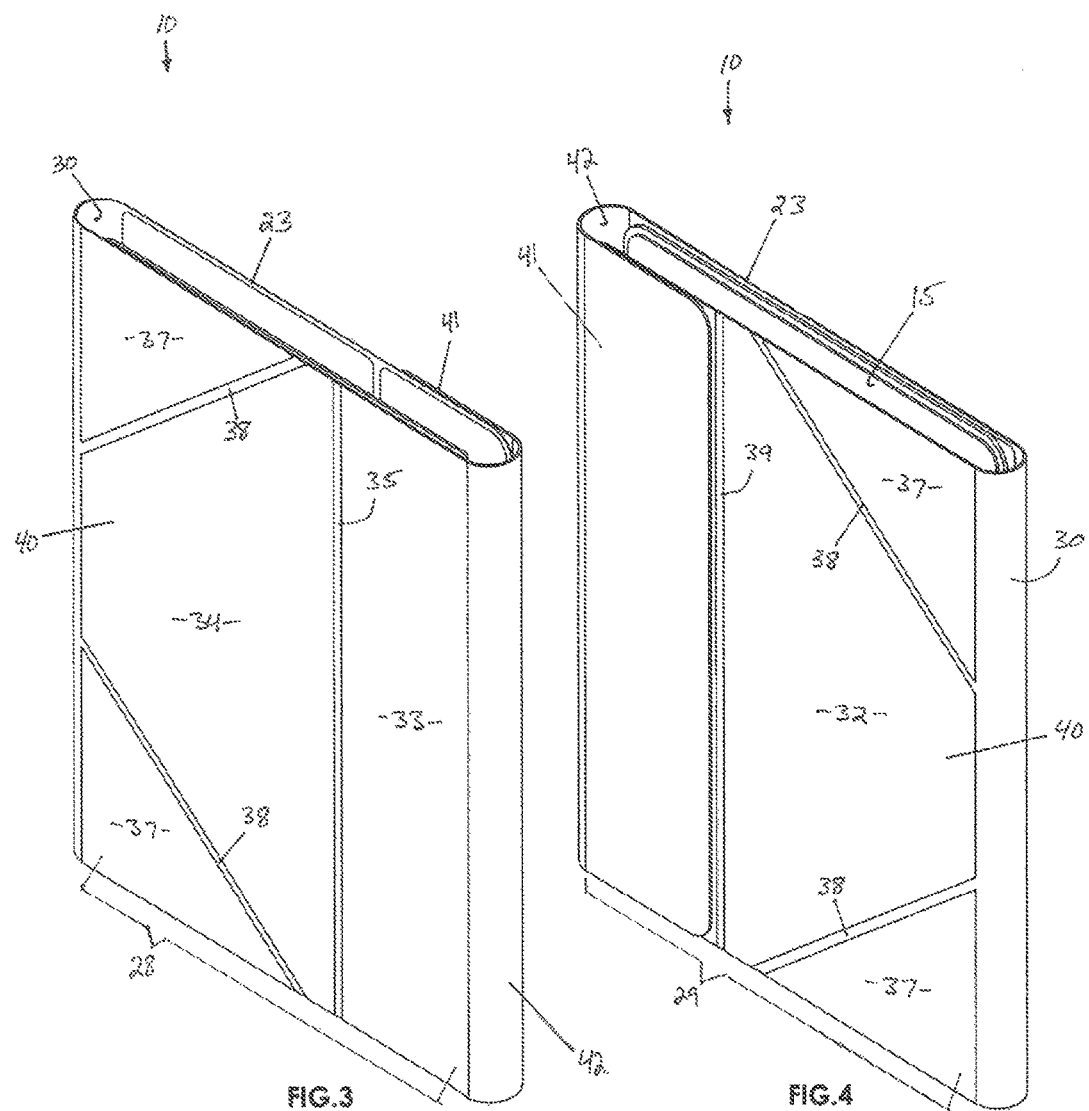

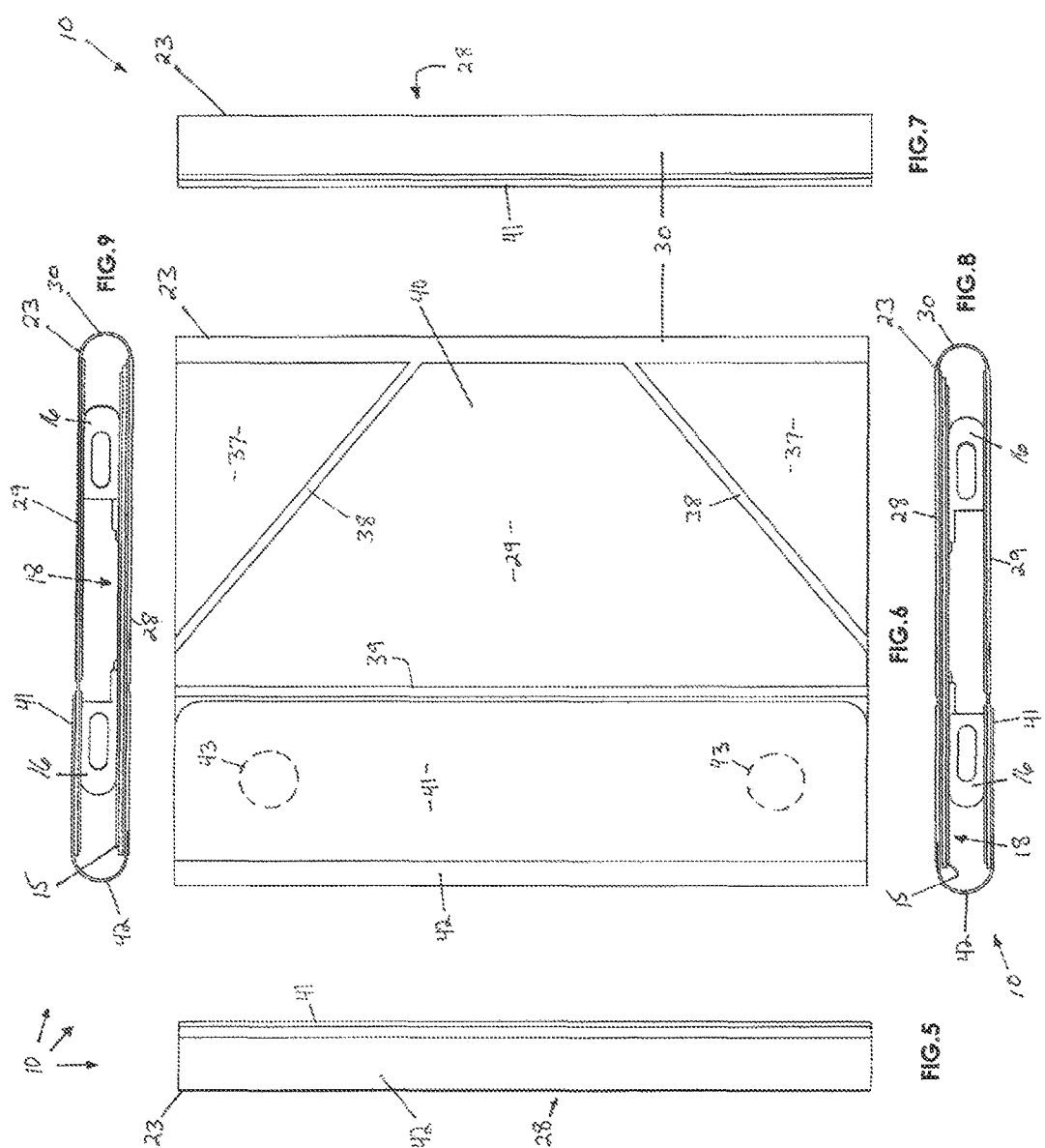

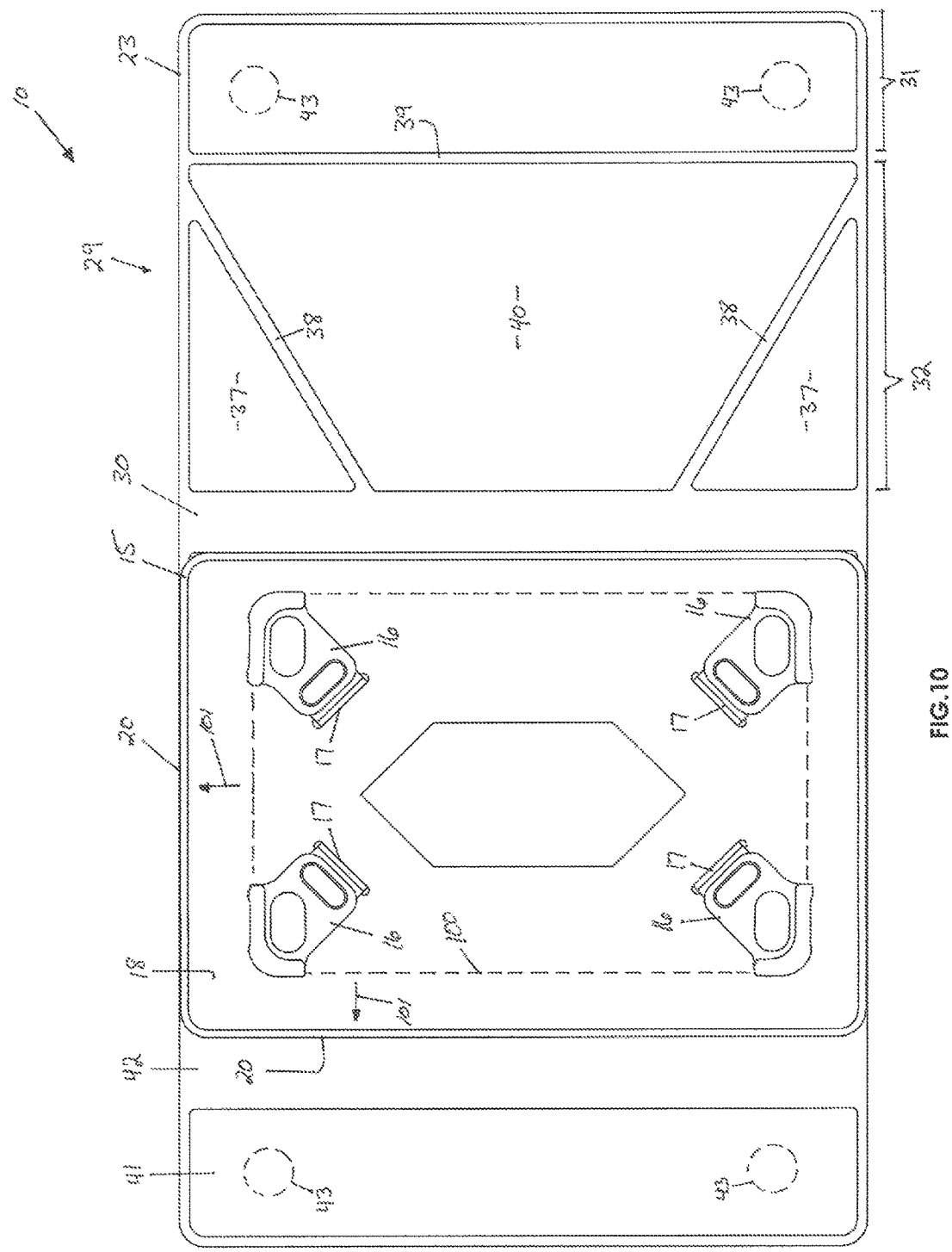

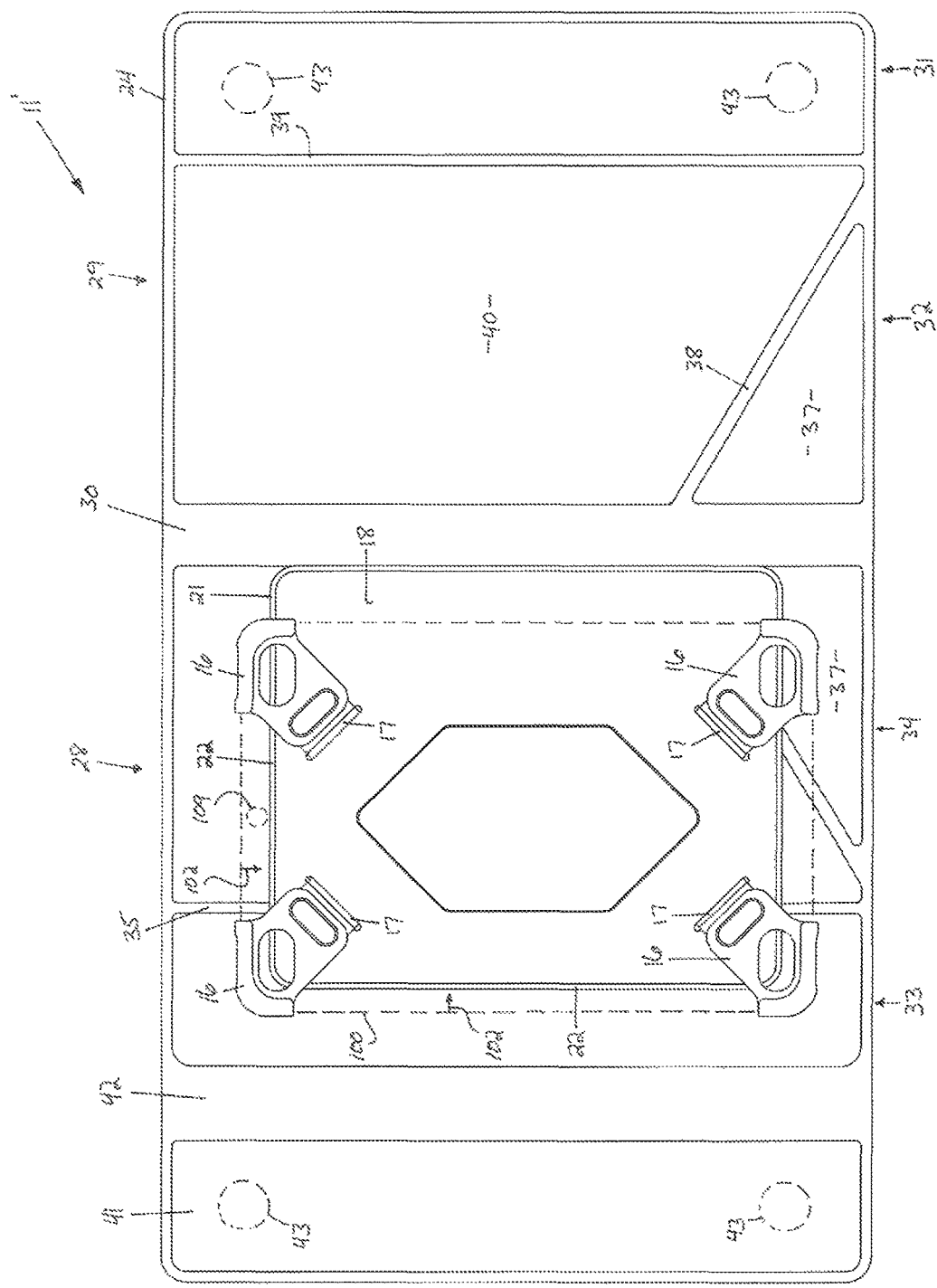

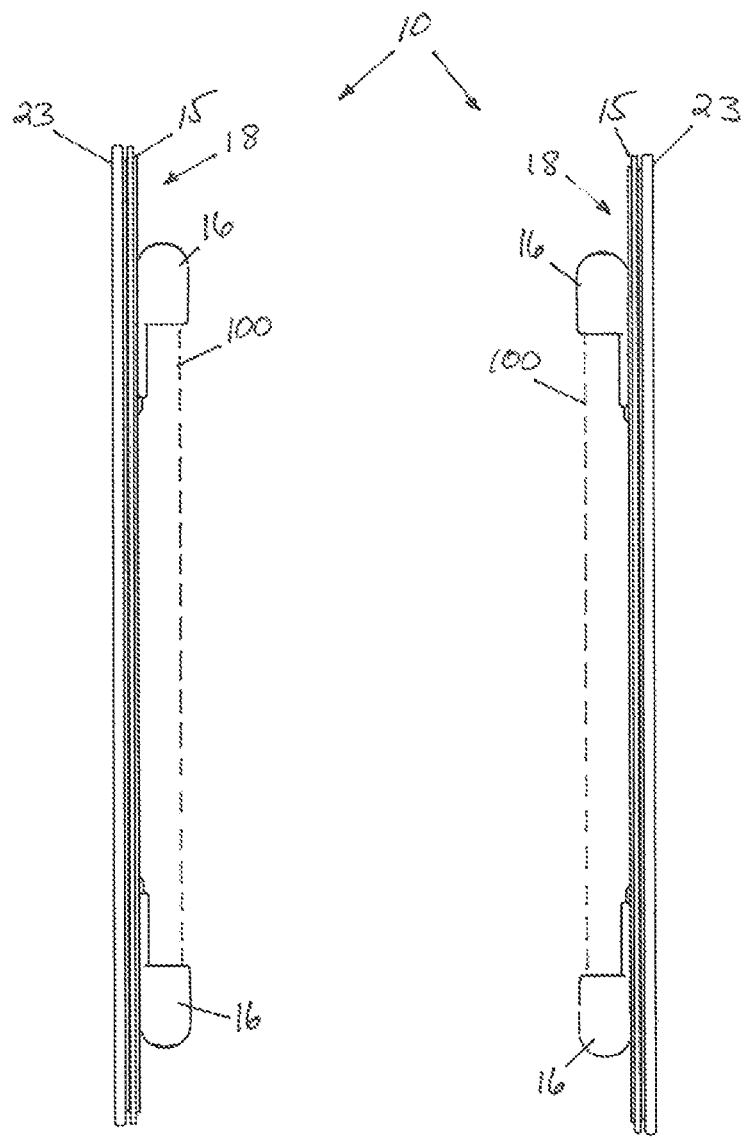

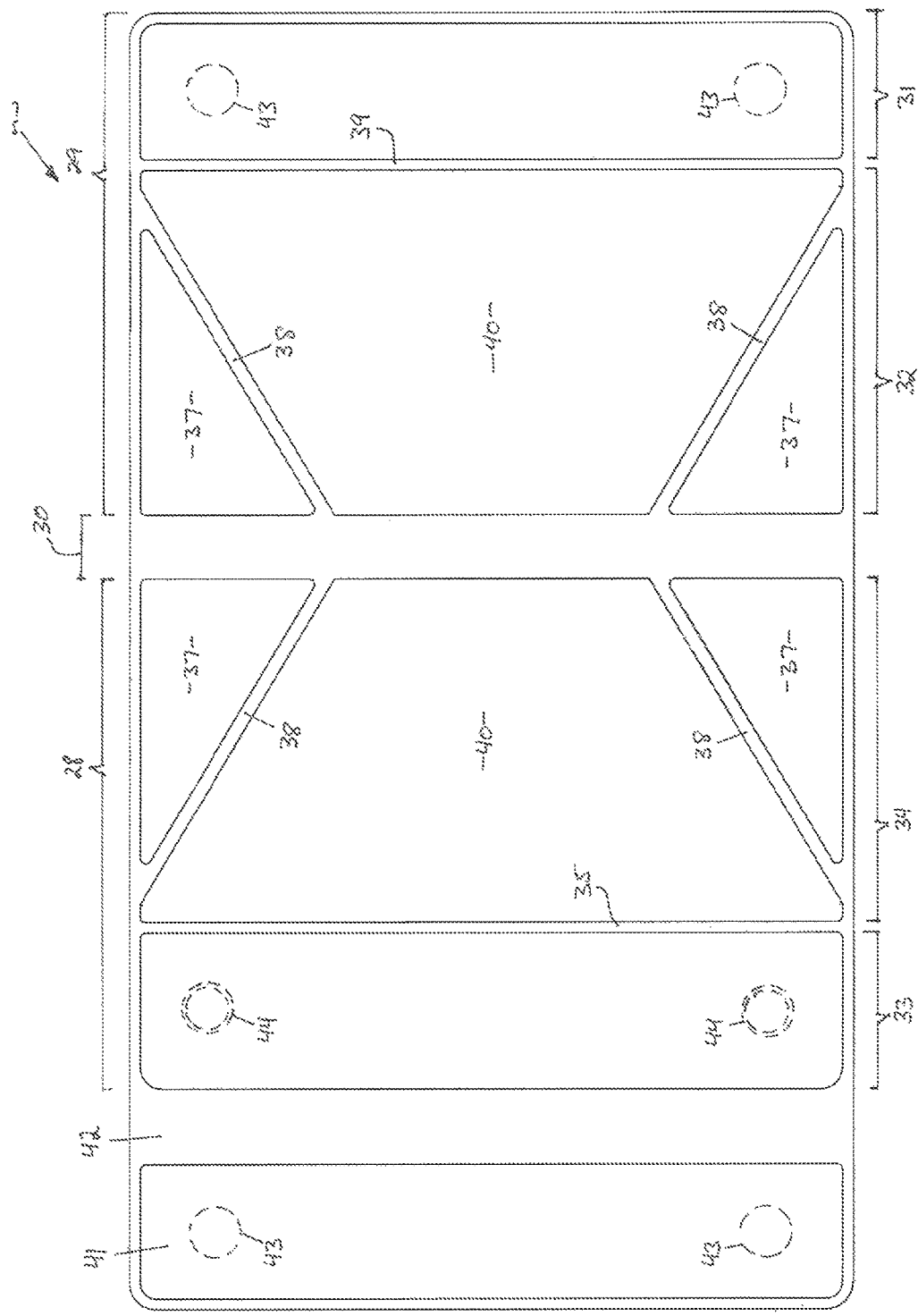

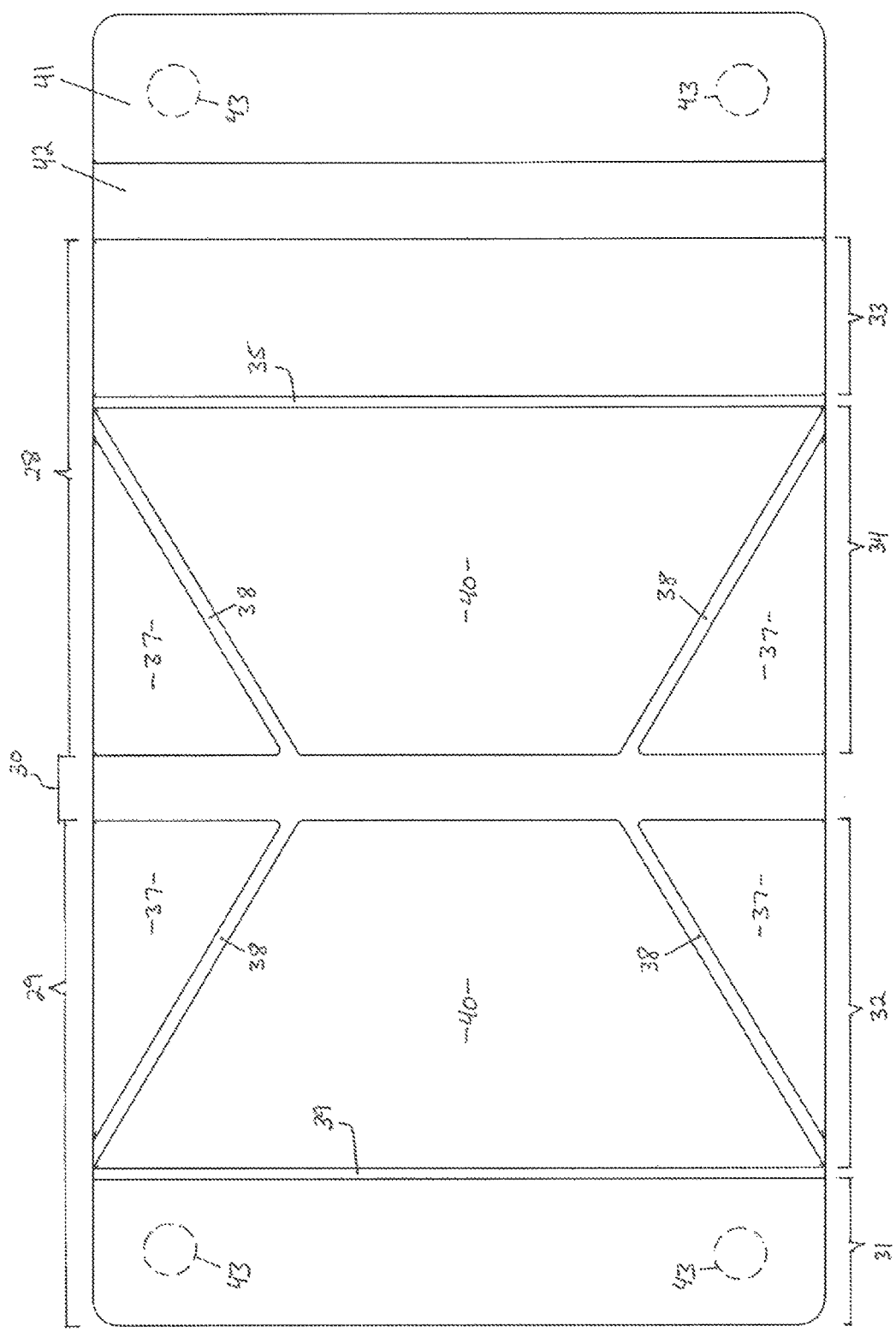

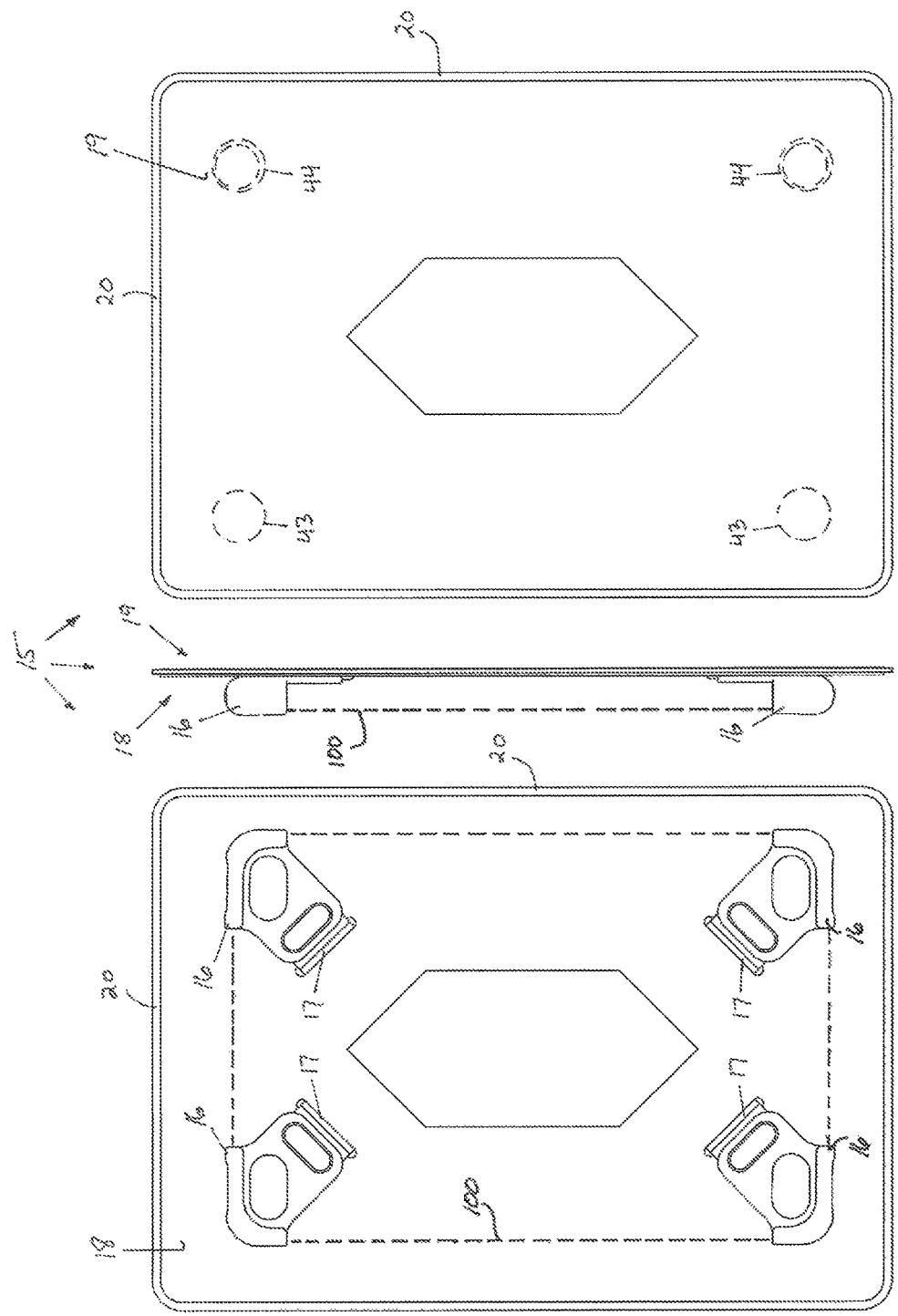

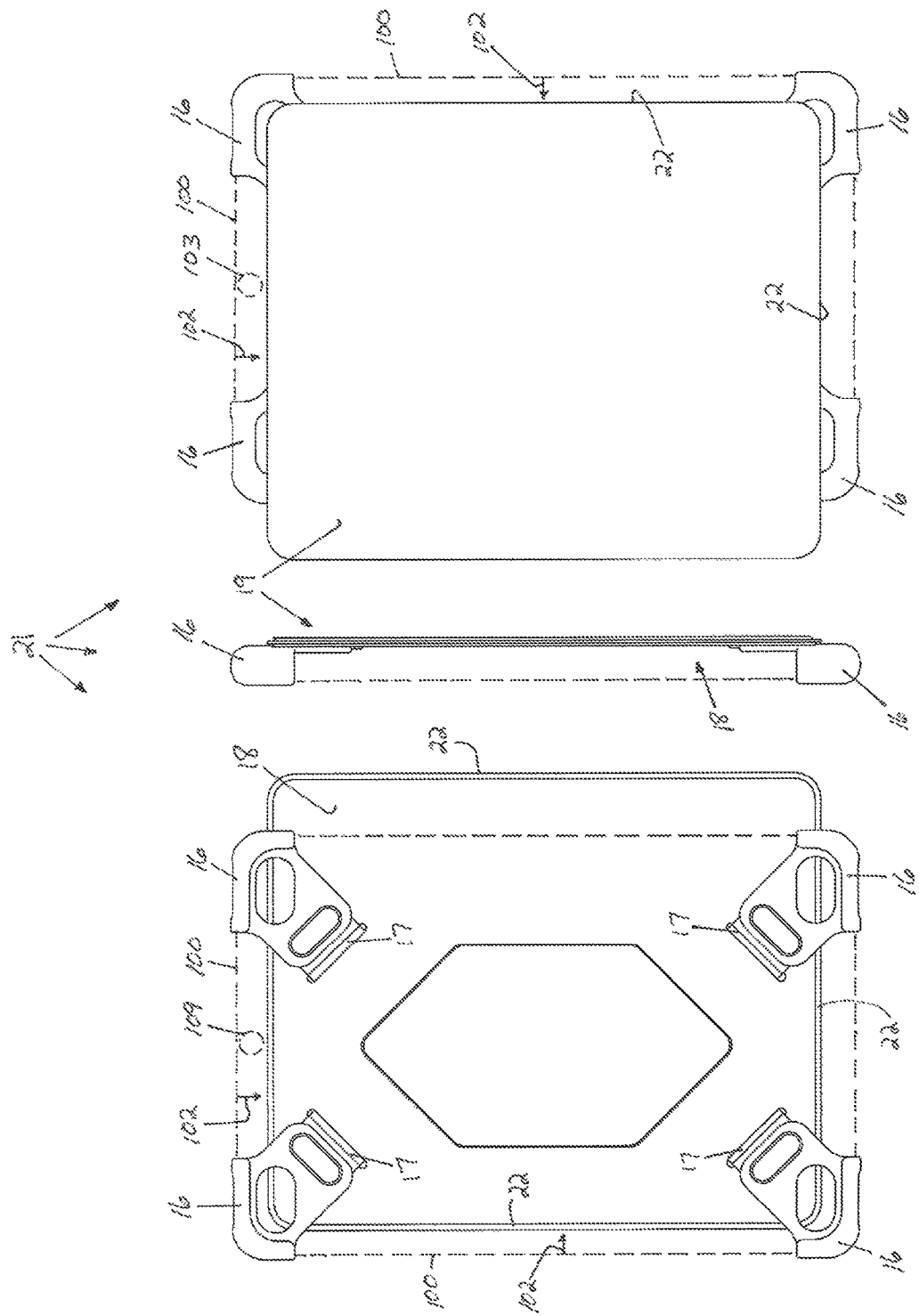

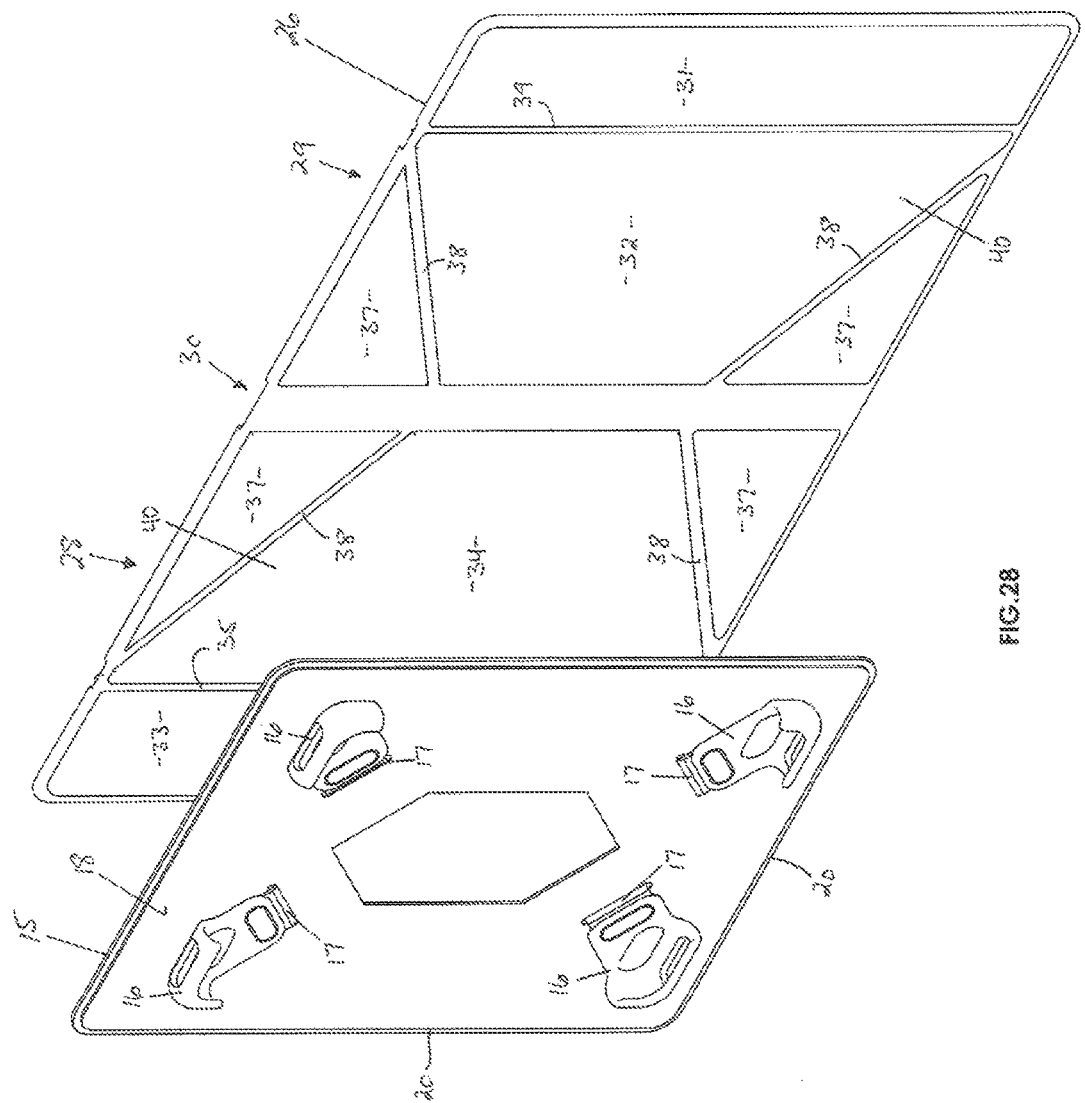

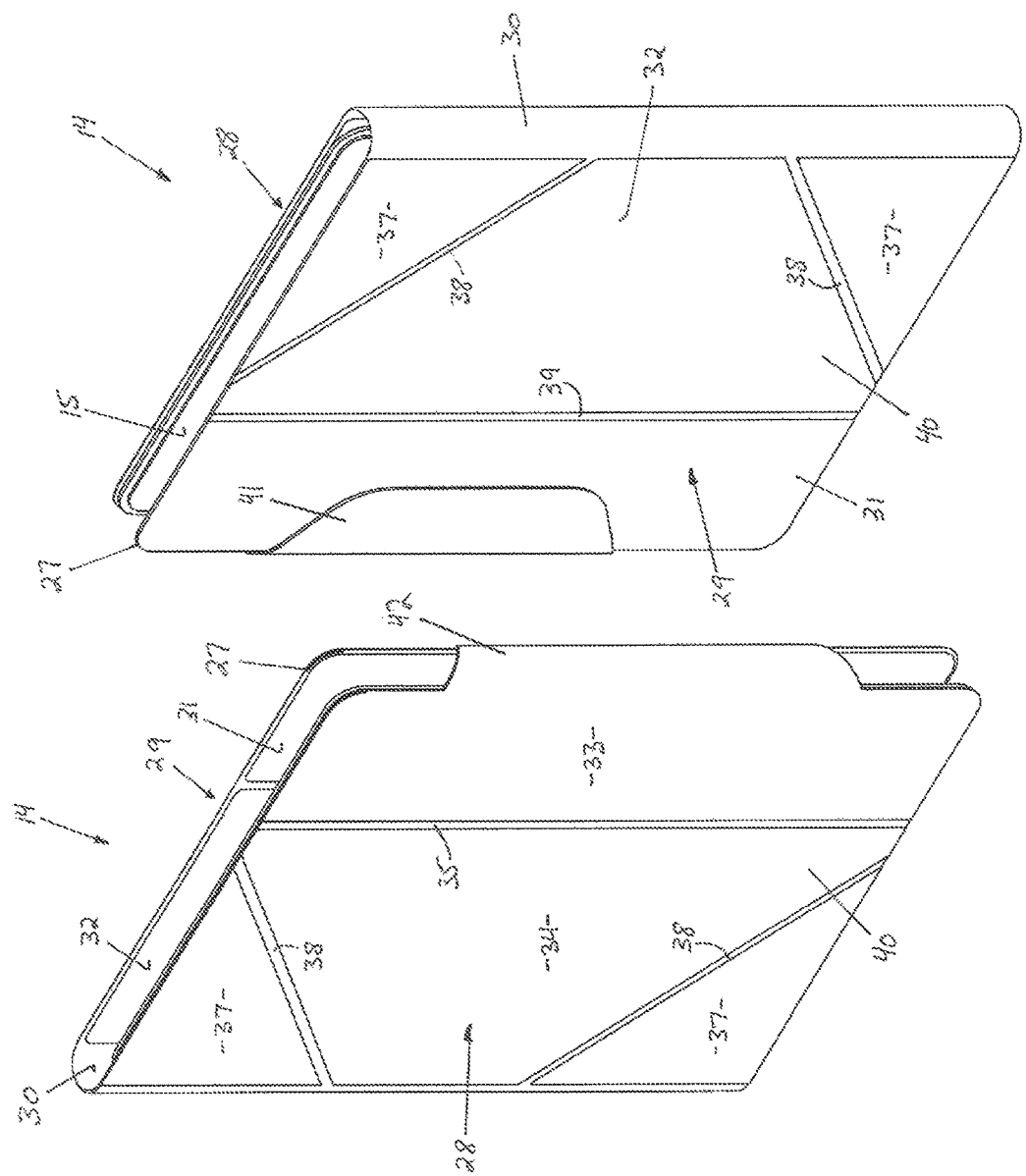

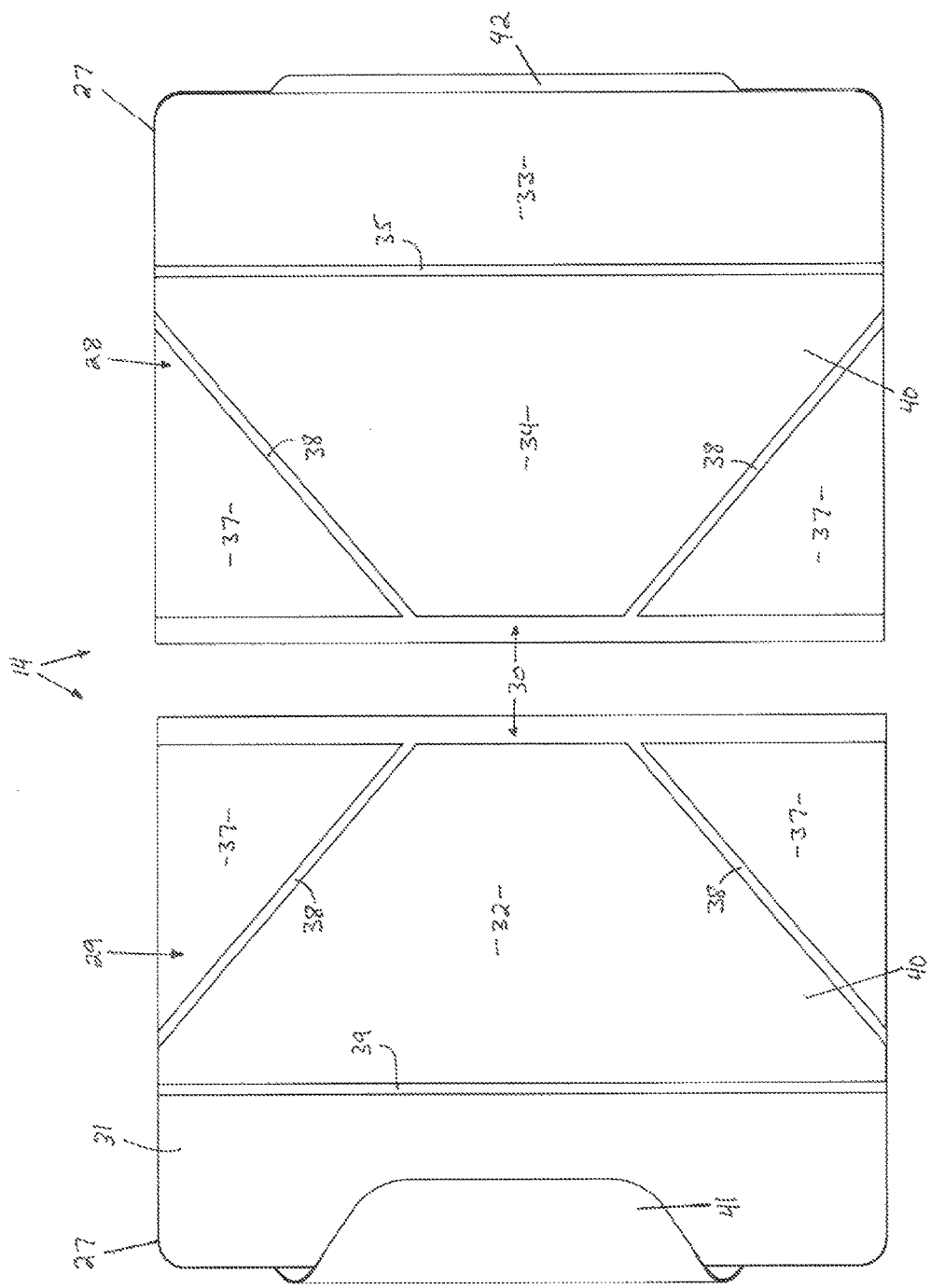

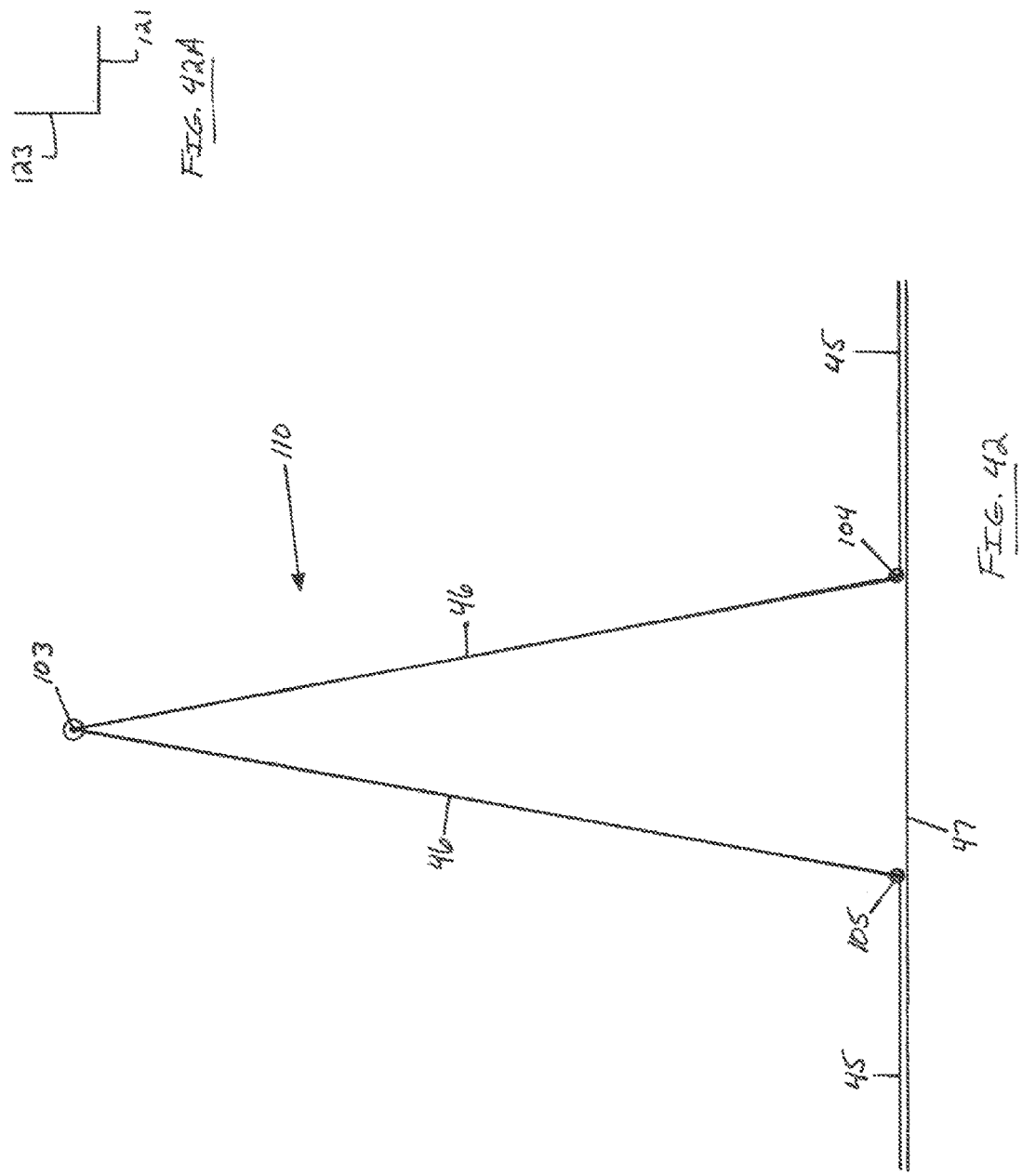

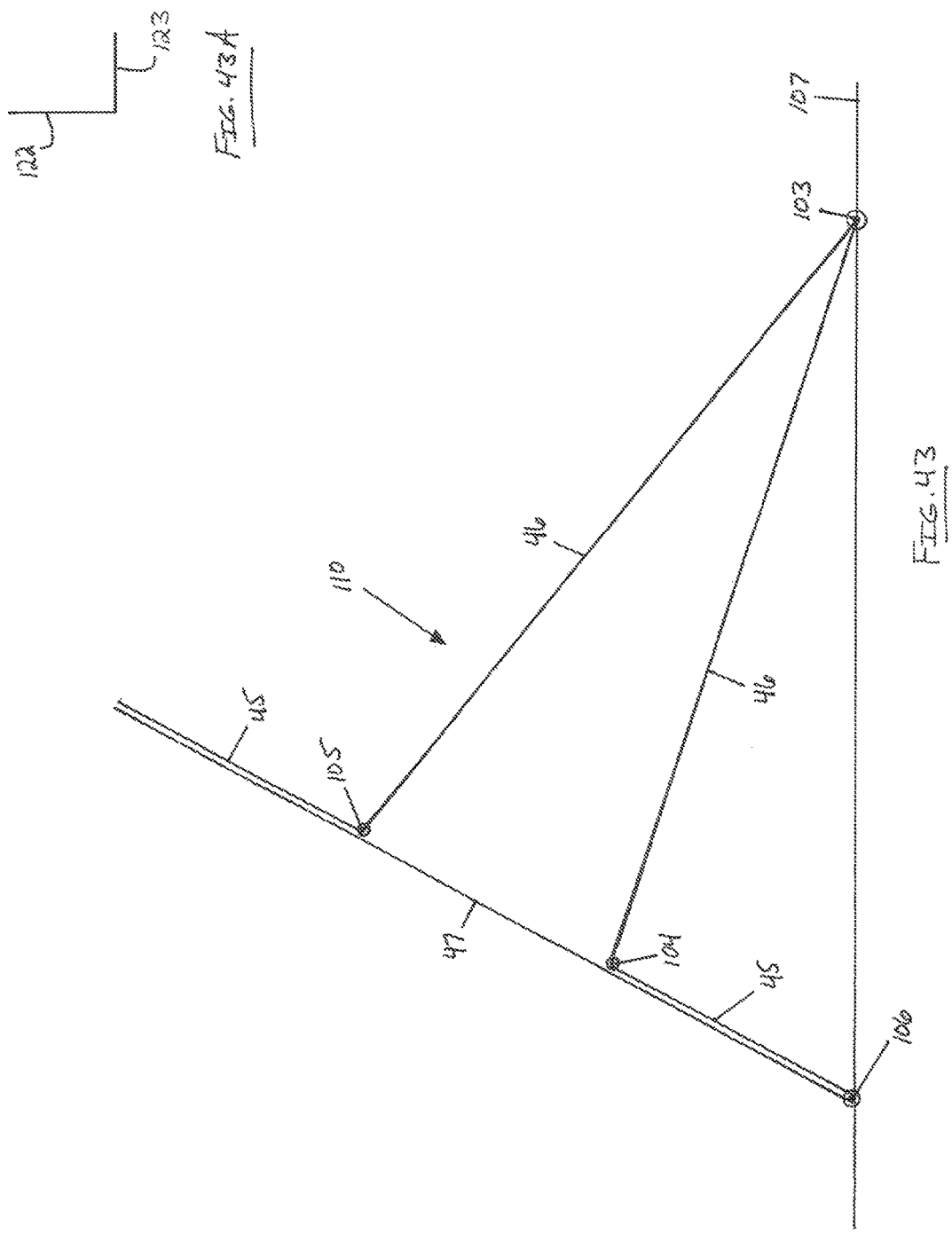

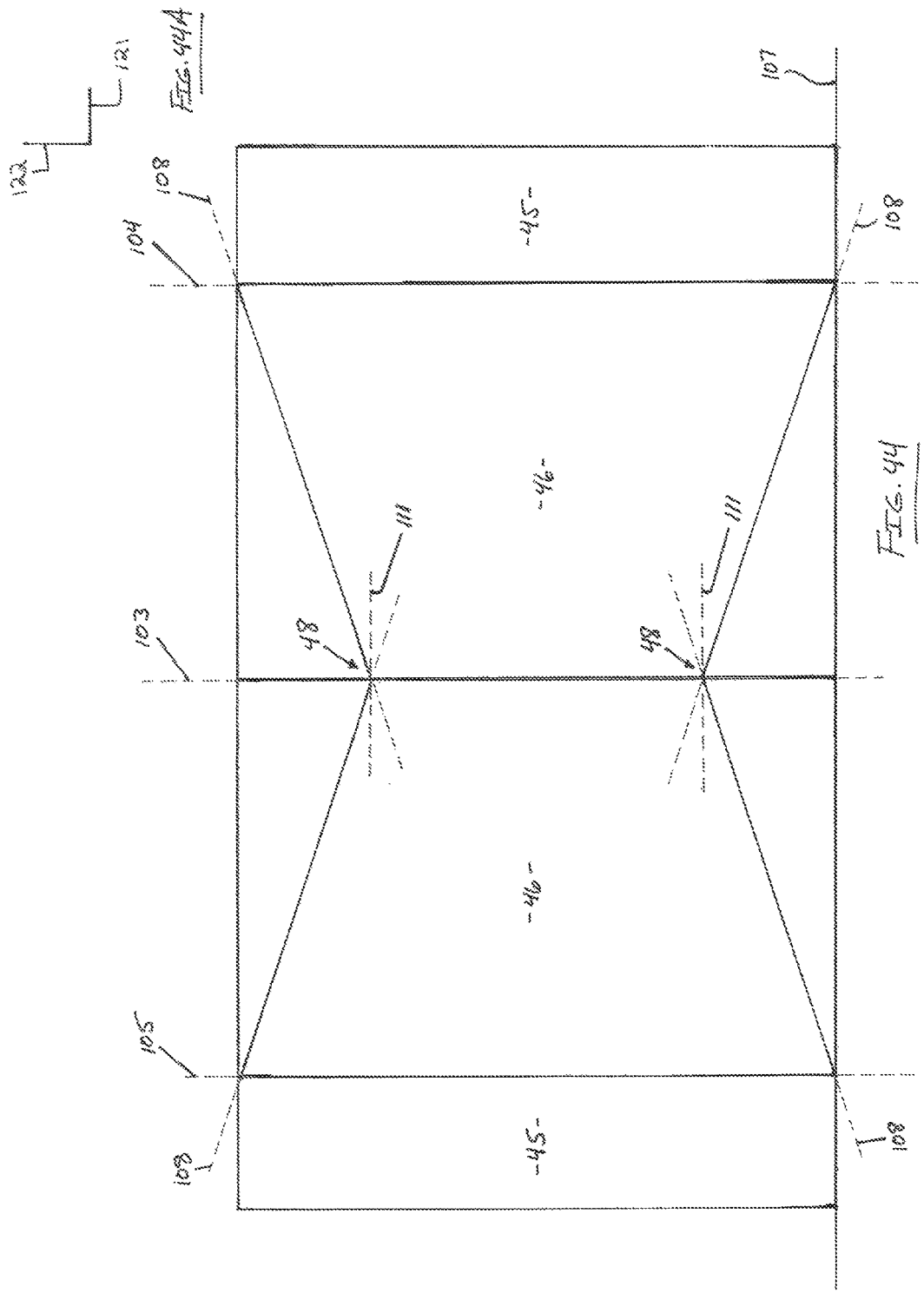

CASE CONSTRUCTION FOR AN ELECTRONIC DEVICE WITH FOLDING DEVICE-SUPPORT FEATURE

PRIOR HISTORY

This patent application claims the benefit of U.S. Provisional Patent Application No. 62/239,930 filed in the United States Patent and Trademark Office on 11 Oct. 2015.

BACKGROUND OF THE INVENTION

Field of the Invention

The disclosed invention generally relates to a case construction for encasing an electronic device such as a laptop type computer, tablet type computer, mobile phone or similar other mobile communications device. More particularly, the disclosed invention provides a device-holding case construction with pivotal sectional features for enabling a user to selectively encase an electronic device and/or selectively display the electronic device in either an angled landscape orientation or an angled portrait orientation.

Brief Description of the Prior Art

Case constructions for use in combination with electronic devices such as tablet type computers, smart phones and the like are well known in this field of art. While the basic function of a basic case construction is to protect and/or enclose the device it encases, the art continues to develop with an eye toward enhancing functionality of the case constructions so as to provide the user with various means of manipulating and/or re-positioning the devices for use and display. Several of the more pertinent prior art patent-related disclosures relating to case constructions and the like for holding and enabling display of the devices they hold are described hereinafter.

U.S. Pat. No. 8,359,078 ('078 patent) and U.S. Pat. No. 8,731,626 ('626 patent), issued to Hung and owned by Belkin International, Inc. of Playa Vista Calif., disclose a Mobile Media Device Enclosure, Method of Use of Mobile Media Device Enclosure, and Method of Providing a Mobile Media Device Enclosure. The '078 and '626 patents each describe certain mobile media device enclosures or cradles having an interior, an exterior, a top side, a bottom side, a right side, and a left side wherein the interior is configured to form a cavity sized and shaped to retain a mobile media device.

The enclosures further include both a vertical boundary and a horizontal boundary. The vertical boundary is configured to substantially bisect the mobile media device enclosure from the top side to the bottom side, and the horizontal boundary is configured to substantially bisect the mobile media device enclosure from the left side to the right side. The vertical and horizontal boundaries are thus configured to substantially divide the mobile media device enclosure into four sections, each of which is flexibly and elastically coupled to two other sections of the four sections, and each of which four sections may be temporarily removed from the electronic device.

U.S. Pat. No. 8,640,864 ('864 patent) and U.S. Pat. No. 9,010,529 ('529 patent), issued to Chen et al. and assigned to ASUSTeK Computer Inc. of Taipei, Taiwan, disclose certain Foldable Covers. The '864 and '529 patents describe foldable covers for protecting or supporting a portable electronic device comprising a supporting unit and a fixing unit. The supporting unit comprises a plurality of first separations, a convergent part and a plurality of first slab-shaped parts. Each first separation is connected to the convergent part. The fixing unit is connected to the supporting unit to fix the portable electronic device. When the first slab-shaped parts are located at the same surface, the supporting unit covers the portable electronic device. When a three dimensional structure is formed by the first separations, the convergent part and the first slab-shaped parts, the supporting unit supports the portable electronic device.

From a review of the foregoing citations in particular, and from a consideration of the prior art in general, it will be seen that the prior art perceives a need for a case construction including both a device-retention mechanism and a multi-section jacket wherein the multi-section jacket comprises or includes multiple parallel primary pivot axes with intersecting oblique pivot axes for enabling secondary pivot axes orthogonal to the primary pivot axes as summarized according to the present invention in more detail hereinafter.

SUMMARY OF THE INVENTION

Among the many objectives of this invention is the basic provision of a case construction or case constructions for selectively encasing and displaying an electronic device. The case construction(s) according to the present invention preferably comprise or include variants of a device-retention mechanism and a multi-section jacket. The device-retention mechanisms according to the present invention basically function to removably retain an electronic device such as a smart phone or tablet type computer.

The device-retention mechanisms preferably and essentially includes an anterior device-retaining section or a frontal device-display portion, and a posterior jacket-opposing section or a back portion. The device-retention mechanism may be permanently attached or removably attached to the multi-section jacket. When removably attachable, it is contemplated that the posterior jacket-opposing section may be outfitted with certain magnetic means or elements for attaching the posterior jacket-opposing section to similarly and cooperably outfitted portions of the corresponding multi-section jacket.

The multi-section jackets according to the present invention are each believed to preferably and essentially comprise or include a mechanism-backing section, a spine section, and a mechanism-covering section. The mechanism-backing sections are preferably sized and shaped to dimensionally cover the posterior jacket-opposing section of the device-retention mechanism and the mechanism-covering sections are preferably sized and shaped to dimensionally cover the anterior device-retaining section of the device-retention mechanism. The spine section pivotally connects the mechanism-covering section to the mechanism-backing section for enabling the user to selectively cover or uncover the device-retention mechanism.

The mechanism-backing section and the mechanism-covering section of the multi-section jacket(s) each preferably and essentially comprise or include spine-opposed foldable portions. The spine-opposed foldable portions are believed central to the practice of the present invention and are cooperatively foldable at or about the similarly foldable or pivotal spine section while mechanism attachment sections of the multi-section jacket attach to the posterior jacket-opposing section of the device-retention mechanism for forming a case support footprint and for enabling the user to selectively support the case construction in a select angled orientation relative to an open and flat case configuration upon the case support footprint.

The case construction according to the present invention may preferably further comprise or include a spine-opposing section and a cover overlap or cover flap section. The spine-opposing section pivotally connects the cover overlap section to the mechanism-backing section and extends in a first direction relative to the device-retention mechanism. The mechanism-covering section extends in a second direction opposite the first direction relative to the device-retention mechanism when in the open and flat case configuration. The cover overlap section is preferably removably attachable to an outer surface of the mechanism-covering section for enabling the user to selectively encase or fully wrap the device-retention mechanism within the multi-section jacket.

The posterior jacket-opposing section of the case construction may be either permanently (e.g. adhesively or stitched) attached to a panel attachment section of the mechanism-backing section or removably attached to said panel attachment section. The panel attachment section extends from the spine-opposing section in certain multi-section jacket embodiments toward the spine section and is pivotally attached to a pivot panel section of the mechanism-backing section extending between the panel attachment section and the spine section.

The mechanism-covering section preferably comprises or includes a mechanism attachment section and a mechanism support section pivotally attached to the mechanism attachment section. The mechanism support section extends from the pivotal or foldable spine section intermediate the spine section and mechanism attachment section. The mechanism attachment section is removably attachable (e.g. via magnetic means for removable attachment) to the posterior jacket-opposing section laterally opposite the panel attachment section for enabling the user to selectively display the device-retention mechanism in the select angled case orientation.

The mechanism attachment section and the panel attachment section are preferably equally dimensioned, and the pivot panel section and mechanism support section are preferably equally dimensioned. The equally dimensioned respective sections enhance footprint symmetry of the case construction for stabilizing the case construction when in the select angled case orientation. In this regard, it will be seen that the multi-section jackets according to the present invention all preferably comprise three parallel pivot axes, namely a (spine) pivot axis extending through the spine section; a cover pivot axis extending through a pivot line of the covering section; and a backing pivot axis extending through a pivot line of the backing section.

The three parallel primary pivot axes thus enable a planar or flat multi-section jacket to be folded into a Λ shape with the jacket-to-mechanism attachment feet of the Λ shape being the structural equivalents of the mechanism and panel attachment sections. The angled jacket support sections of the Λ shape are the structural equivalents of the pivot panel and mechanism support sections. The substantially planar device-retention mechanism forms a solid gap-traversing base element.

In other words, the gap between the jacket-to-mechanism attachment feet is traversed by the device-retention mechanism to close the triangle of a Δ-shaped case support footprint. Together, the Λ shape of the multi-section jacket and the planar shape of the device-retention mechanism form the Δ shaped case support footprint for supporting the case construction in the select angled case orientation.

Alternatively, the case construction may be placed into a landscape orientation such that certain edging of the Λ shaped jacket are in contact with the support surface. The ideal support interface defines two lines parallel to one another, and thus the case construction according to the present invention may be said to be characterized by being alternatively supportable by either (a) a Δ shaped footprint in a first series of case orientations with the Δ shaped footprint extending in a first two-dimensional support surface or plane, or at parallel edging also extending in the first two-dimensional support surface or plane.

The case constructions according to the present invention may thus basically function to selectively encase and displaying an electronic device. To achieve these basic functions, the case constructions according to the present invention may be said to essentially comprise or include a substantially planar device-retention mechanism for removably retaining an electronic device and a multi-section jacket having sections angled to one another for forming alternative support footprints. The multi-section jacket basically comprises a backing section, a covering section, and at least three parallel primary pivot axes.

The covering section is pivotally connected to the backing section via a first primary pivot axis of the at least three parallel primary pivot axes for enabling the user to selectively cover or uncover a mechanism-held device. The multi-section jacket is further pivotal about the three parallel pivot axes for forming a Λ-shaped support footprint. The substantially planar device-retention mechanism traverses a gap of the Λ-shaped support footprint for enabling a Δ-shaped support footprint. The Δ-shaped support footprint enables the user to alternatively display said device-retention mechanism upon either the Δ-shaped case support footprint on a support plane or upon parallel edging on the support plane.

Spine section structure associated with the first of the at least three parallel primary pivot axes comprises or includes at least one secondary pivot axis orthogonal to the primary pivot axis at the spine section. The spine section structure associated with the first of the at least three parallel pivot axes is pivotal about the at least one secondary pivot axis for enabling the user to display the device-retention mechanism in a select case orientation upon the Δ-shaped support footprint. The at least one secondary pivot axis is formed by the intersection of at least two oblique pivot axes uniformly and structurally intersecting the at least three parallel pivot axes at a pivot axis intersection.

In this last regard, the pivot panel section and the mechanism support section may each preferably comprise or include at least one pair of spine-opposed foldable portions. Certain multi-section jackets comprise or include a single pair of spine-opposed foldable portions while certain other multi-section jackets comprise or include two (top end versus bottom end) pairs of spine-opposed foldable portions. Each foldable portion within each pair is simultaneously foldable inwardly relative to the pivot panel section and mechanism support section for enabling the user to display the device-retention mechanism in the select case orientation.

When outfitted with two pairs of spine-opposed foldable portions as in the case of certain multi-section jackets, the user may thus upend or invert the subject case construction to achieve either a similar select angled case orientation or a varied angled case orientation. If the two pairs of spine-opposed foldable portions are equally dimensioned, the equally dimensioned pairs of spine-opposed foldable portions enhance the symmetry of the case construction when in any of the angled case orientations. If the two pairs of spine-opposed foldable portions are differently sized and shaped, alternative display angles can then be implemented by the user.

Other objects of the present invention, as well as particular features, elements, and advantages thereof, will be elucidated or become apparent from, the following description and the accompanying drawing figures.

BRIEF DESCRIPTION OF THE DRAWINGS

Other features and objectives of the invention will become more evident from a consideration of the following brief descriptions of patent drawings:

FIG. 1 is a first anterior plan view of a first alternative case construction according to the present invention depicting the first alternative case construction in a fully closed or device-jacketed or device-wrapped case configuration.

FIG. 2 is a posterior plan view of the first alternative case construction according to the present invention depicting the first alternative case construction in the fully closed or device-jacketed or device-wrapped case configuration.

FIG. 3 is a posterior perspective view of the first alternative case construction according to the present invention depicting the first alternative case construction in the fully closed or device-jacketed or device-wrapped case configuration.

FIG. 4 is an anterior perspective view of the first alternative case construction according to the present invention depicting the first alternative case construction in the fully closed or device-jacketed or device-wrapped case configuration.

FIG. 5 is a spine-opposed edge view of the first alternative case construction according to the present invention depicting the first alternative case construction in the fully closed or device-jacketed or device-wrapped case configuration.

FIG. 6 is a second anterior plan view of a first alternative case construction according to the present invention re-presented in side-by-side relation with FIGS. 5 and 7-9 for purposes of illustrative comparison purposes.

FIG. 7 is a spine section edge view of the first alternative case construction according to the present invention depicting the first alternative case construction in the fully closed or device-jacketed or device-wrapped case configuration.

FIG. 8 is a bottom end view of the first alternative case construction according to the present invention depicting the first alternative case construction in the fully closed or device-jacketed or device-wrapped case configuration.

FIG. 9 is a top end view of the first alternative case construction according to the present invention depicting the first alternative case construction in the fully closed or device-jacketed or device-wrapped case configuration.

FIG. 10 is an anterior plan view of the first alternative case construction according to the present invention depicting the first alternative case construction in a fully open and flat case configuration showing a first alternative device-retention mechanism positioned atop a first alternative multi-section jacket with a phantom electronic device retained by the first alternative device-retention mechanism.

FIG. 10A is an anterior plan view of a second alternative case construction according to the present invention depicting the second alternative case construction in a fully open and flat case configuration showing a second alternative device-retention mechanism positioned atop a second alternative multi-section jacket with a phantom electronic device retained by the second alternative device-retention mechanism.

FIG. 14 is a first lateral edge view of the first alternative case construction according to the present invention depicting certain first lateral edge details of the first alternative device-retention mechanism in combination with the first alternative multi-section jacket with a phantom electronic device retained by the first alternative device-retention mechanism.

FIG. 15 is a second lateral edge view of the first alternative case construction according to the present invention depicting certain second lateral edge details of the first alternative device-retention mechanism in combination with the first alternative multi-section jacket with a phantom electronic device retained by the first alternative device-retention mechanism.

FIG. 17 is an anterior plan view of the first alternative multi-section jacket according to the present invention in a fully open and flat jacket configuration with optional and embedded magnets being shown in broken lining.

FIG. 18 is a posterior plan view of the first alternative multi-section jacket according to the present invention in a fully open and flat jacket configuration with optional and embedded magnets being shown in broken lining.

FIG. 19 is an anterior plan view of the first alternative device-retention mechanism according to the present invention with a phantom electronic device retained by the first alternative device-retention mechanism.

FIG. 20 is a first lateral edge view of the first alternative device-retention mechanism according to the present invention with a phantom electronic device retained by the first alternative device-retention mechanism.

FIG. 21 is a posterior plan view of the first alternative device-retention mechanism according to the present invention with optional and embedded magnets being shown in broken lining.

FIG. 19A is an anterior plan view of the second alternative device-retention mechanism according to the present invention with a phantom electronic device retained by the second alternative device-retention mechanism.

FIG. 20A is a first lateral edge view of the second alternative device-retention mechanism according to the present invention with a phantom electronic device retained by the second alternative device-retention mechanism.

FIG. 21A is a posterior plan view of the second alternative device-retention mechanism according to the present invention with optional and embedded magnets being shown in broken lining.

FIG. 28 is an exploded anterior perspective view of the fifth alternative case construction according to the present invention in a fully open and flat case configuration depicting the first alternative device-retention mechanism exploded from the fourth alternative multi-section jacket.

FIG. 31A is a posterior perspective view of a sixth alternative case construction according to the present invention depicting the sixth alternative case construction in a fully closed or device-jacketed or device-wrapped case configuration.

FIG. 31B is an anterior perspective view of the sixth alternative case construction according to the present invention depicting the sixth alternative case construction in the fully closed or device-jacketed or device-wrapped case configuration.

FIG. 32A is an anterior plan view of the sixth alternative case construction according to the present invention depicting the sixth alternative case construction in the fully closed or device-jacketed or device-wrapped case configuration.

FIG. 32B is a posterior plan view of the sixth alternative case construction according to the present invention depicting the sixth alternative case construction in the fully closed or device-jacketed or device-wrapped case configuration.

FIG. 42 is a first diagrammatic depiction of the basic structures of the case construction according to the present invention showing three pivot axes of the multi-section jacket directed out of/into the page for forming a Λ-shaped multi-section jacket and a substantially planar device-retention mechanism closing a gap of the Λ-shaped multi-section jacket for forming a Δ-shaped footprint in the two-dimensional support surface plane.

FIG. 42A is a simplistic diagram of a Cartesian coordinate plane showing the two-dimensional nature of the support surface plane otherwise described in FIG. 42.

FIG. 43 is a second diagrammatic depiction of the basic structures of the case construction according to the present invention shown supported upon a support surface with the three primary pivot axes of the multi-section jacket being depicted along with obliquely intersecting pivot axes for enabling first a second secondary pivot axes at the spine section of the multi-section jacket.

FIG. 43A is a simplistic diagram of a Cartesian coordinate plane showing the two-dimensional nature of the multi-section jacket as supported upon the support surface plane otherwise described in FIG. 43.

FIG. 44 is a third diagrammatic plan type depiction of the basic structures of the case construction according to the present invention with three primary pivot axes of the multi-section jacket being depicted along with obliquely intersecting pivot axes for enabling first a second secondary pivot axes at the spine section of the multi-section jacket.

FIG. 44A is a simplistic diagram of a Cartesian coordinate plane showing the two-dimensional nature of the multi-section jacket otherwise described in FIG. 44.

DETAILED DESCRIPTION OF THE PREFERRED EMBODIMENTS

Figure 11:
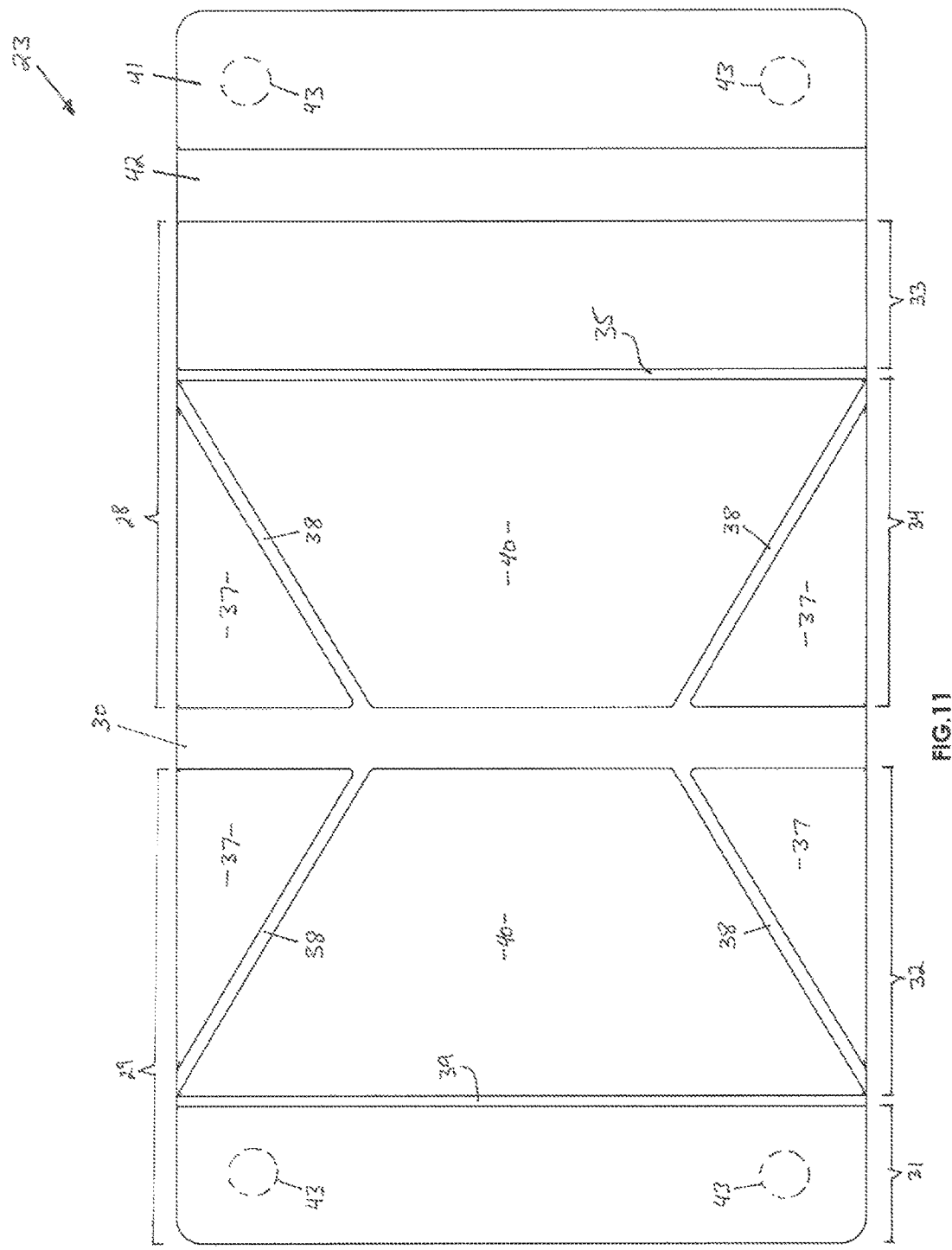
FIG. 11 is a first posterior plan view of the first alternative case construction according to the present invention depicting the first alternative case construction in a fully open and flat case configuration showing certain details of the first alternative multi-section jacket.
Figure 12:
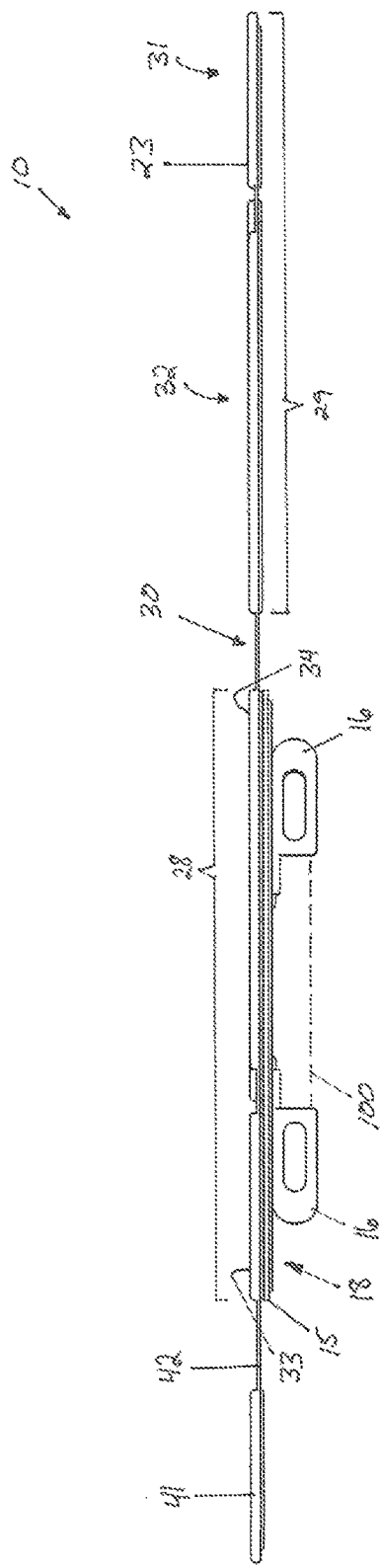
FIG. 12 is a top edge view of the first alternative case construction according to the present invention depicting the first alternative case construction in a fully open and flat case configuration showing certain details top edge details of the first alternative device-retention mechanism in combination with the first alternative multi-section jacket with a phantom electronic device retained by the first alternative device-retention mechanism.

Referring now to the drawings with more specificity, the present invention preferably provides a case construction as variously exemplified at 10, 11, 11', 12, 13, 13' and 14 for selectively encasing and displaying an electronic device 100 as generally depicted at phantom or broken lines, but otherwise not specifically illustrated. Case construction 10 illustrates a first alternative embodiment; case construction 11 illustrates a second alternative embodiment; case construction 11' illustrates a third alternative embodiment; case construction 12 illustrates a fourth alternative embodiment; case construction 13 illustrates a fifth alternative embodiment; case construction 13' illustrates a sixth alternative embodiment; and case construction 14 illustrates a seventh alternative embodiment according to the present invention. All alternative embodiments are believed to embrace or comprise certain unifying features or elements and properly and respectively illustrative of the subject invention.

Each of the case constructions 10, 11, 11', 12, 13, 13', and 14 preferably comprises a device-retention mechanism for removably retaining an electronic device 100 and a multi-section jacket for covering or encasing the electronic device 100 as retained or held by the device-retention mechanism.

Central to the practice of the present invention is the multi-section jacket's further provision of device display functionality for enabling the user to selectively and variously display the electronic device in a number of case orientations or configurations for device use. It is contemplated that the electronic device 100 may be exemplified by any number of communications devices or hand held computers such as smart phones, tablet type computers, and the like, which devices are typically made more effectively useful if displayed for use in an angled orientation relative to a flat or horizontal configuration or orientation.

An exemplary device-retention mechanism is generally depicted and referenced at 15 throughout the drawings or illustrations submitted in support of these specifications. The device-retention mechanism illustrated and referenced at 15 is an exemplary mechanical feature, and should not be viewed as limiting. The particular device-retention mechanism illustrated at 15 may commonly be referred to as a universal device-retention mechanism having corner brackets 16 attached to elastic elements 17 for receiving and retaining a number of variously sized electronic devices typically rectangular in overall shape. It is contemplated that other device-retention mechanisms of fixed size and shape or of various universal or adjustable means for receiving devices may be used in combination with the multi-section jacket element. The illustrated device-retention mechanism is presented to illustrate the basic concepts thereof as usable in combination with the multi-section jacket element believed central to the practice of the present invention.

The corner brackets 16 and elastic elements 17 illustrated throughout the drawings are, in this exemplified device-retention mechanism 15, shown attached to or assembled with a board or plate element having an anterior face as at 18 in adjacency to which face 18 an electronic device may be retained. The board or plate element further comprises a posterior face as at 19 which face 19 opposes the multi-section jacket(s) according to the present invention. The device-retention mechanism 15 according to the present invention may thus be said to preferably comprise an anterior device-retaining section or face as at 18 and a posterior jacket-opposing section or face as at 19.

The outer edging 20 of the device-retention mechanism 15 is preferably formed outwardly (as at arrows 101) relative to the edging of the mechanism-retained or mechanism-held electronic device 100 as generally depicted in FIG. 10. In structural contrast to device-retention mechanism 15, an alternative device-retention mechanism 21 is contemplated as generally depicted in FIGS. 10A, 19A, 20A, 21A and 39A. Device-retention mechanism 21 provides outer edging 22 formed inwardly (as at arrows 102) relative to the edging of mechanism-retained electronic device 100. The outer edging 22 is preferably formed inwardly of the edging of the mechanism-retained electronic device 100 in mechanism 21 for enabling edge-based functionality of the mechanism-retained electronic device 100 such as camera functionality via, for example, a camera lens as at 109.

The multi-section jackets according to the present invention are variously illustrated and exemplified at multi-section jacket versions 23, 24, 25, 26, and 27. Case construction 10 is illustrated as comprising the device-retention mechanism 15 in combination with multi-section jacket version 23; case construction 11 is illustrated as comprising the device-retention mechanism 15 in combination with multi-section jacket version 24; case construction 11' is illustrated as comprising the device-retention mechanism 21 in combination with multi-section jacket version 24; case construction 12 is illustrated as comprising the device-retention mechanism 15 in combination with multi-section jacket version 25; case construction 13 is illustrated as comprising the device-retention mechanism 15 in combination with multi-section jacket version 26; case construction 13' is illustrated as comprising the device-retention mechanism 21 in combination with multi-section jacket version 26; and case construction 14 is illustrated as comprising the device-retention mechanism 15 in combination with multi-section jacket version 27.

Figure 39:
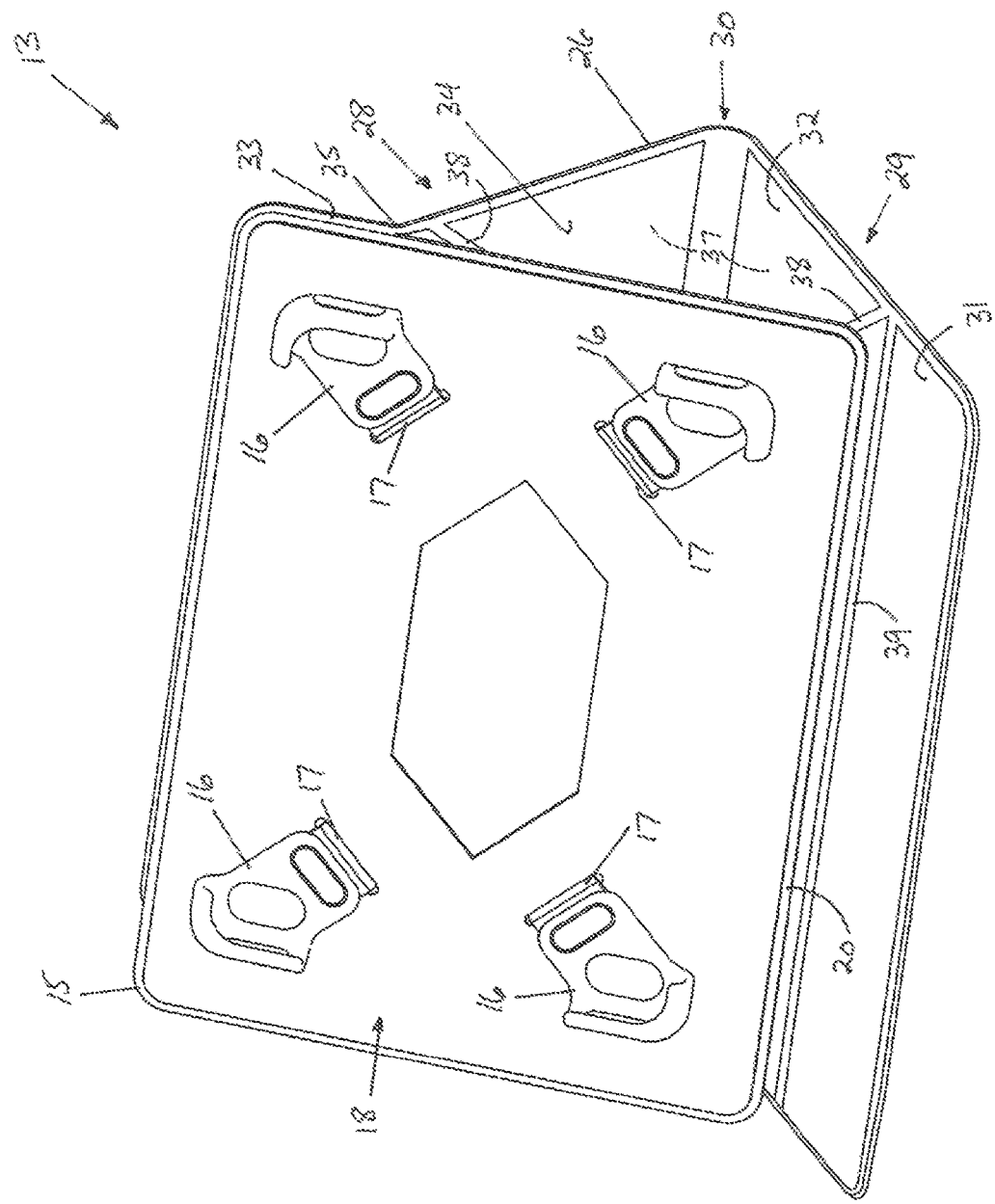
FIG. 39 is an anterior perspective view of the fourth alternative case construction according to the present invention in a first select case orientation or condition of use, namely, an angled landscape orientation for the anterior portion of the first alternative device-retention mechanism with only an upper jacket-to-mechanism attachment foot attached to the posterior jacket-opposing section of the first alternative device-retention mechanism.
Figure 39A:
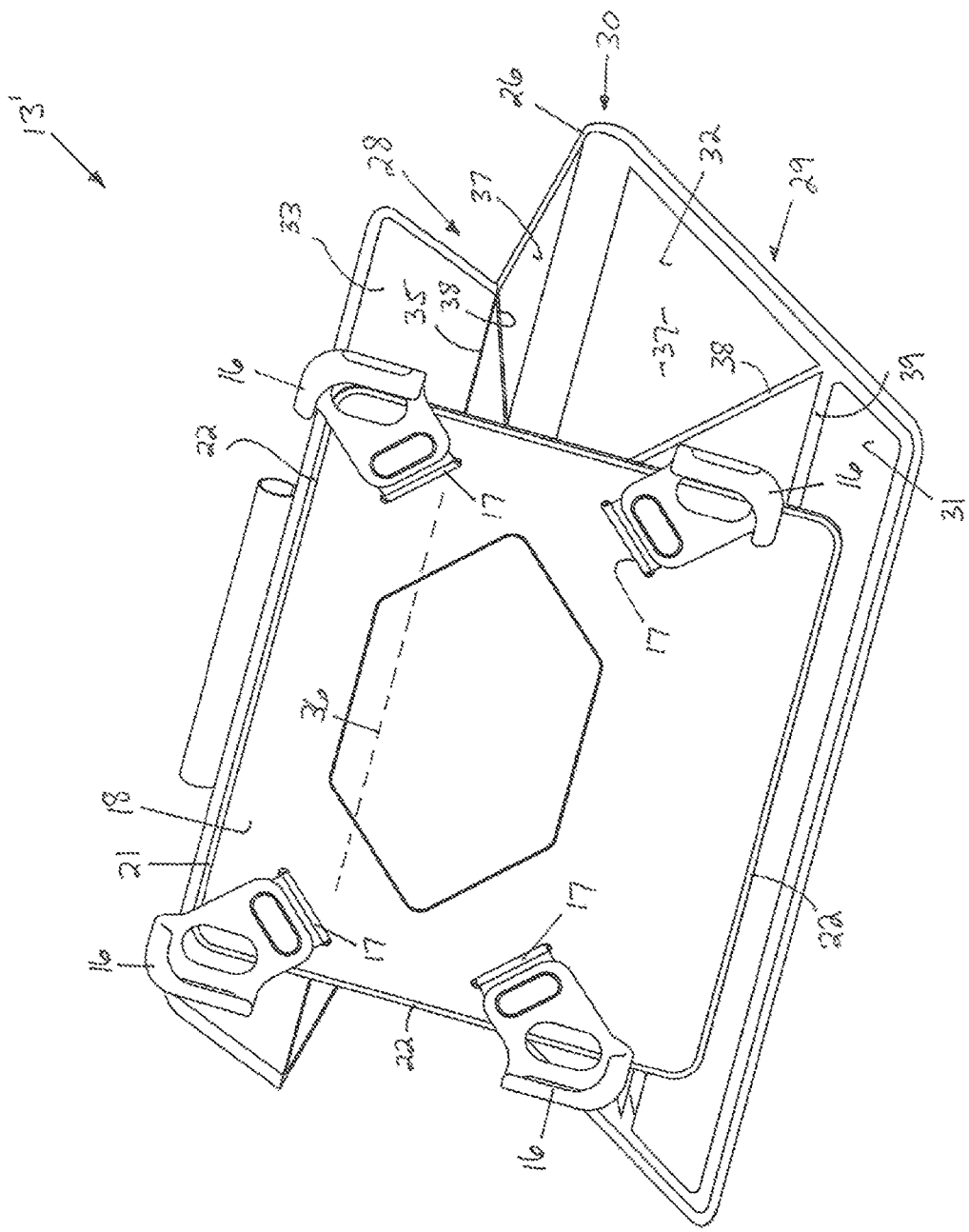
FIG. 39A is an anterior perspective view of a seventh alternative case construction according to the present invention in a first select case orientation or condition of use, namely, an angled landscape orientation for the anterior portion of the first alternative device-retention mechanism with only an attachment seam or line attached to the posterior jacket-opposing section of the second alternative device-retention mechanism.

When alternative device-retention mechanism 21 is used in combination with multi-section jacket 24, the resulting assembly or case construction is generally depicted and referenced at 11' as in FIG. 10A. When alternative device-retention mechanism 21 is used in combination with multi-section jacket 26, the resulting assembly or case construction is generally depicted and referenced at 13' as in FIG. 39A. Alternative device-retention mechanism 21 is further depicted and referenced in FIGS. 19A, 20A, and 21A in direct comparison to device-retention mechanism 15 otherwise comparatively illustrated in FIGS. 19, 20, and 21. From a comparative inspection of FIGS. 19, 20, and 21 versus FIGS. 19A, 20A, and 21A the reader will consider that device-retention mechanism 21 enables edge feature use of the electronic device 100 when the case constructions 11' and 13' are in an angled case orientation as generally depicted in FIG. 39A.

Multi-section jackets 23, 24, 25, 26, and 27 each preferably comprise a mechanism-backing section or more simply backing section as at 28 and a mechanism-covering section or more simply covering section as at 29. The backing sections 28 are preferably sized and shaped or dimensioned to posteriorly cover a mechanism-held device 100, and the covering sections 29 are preferably sized and shaped or dimensioned to anteriorly cover the mechanism-held device 100. The covering sections 29 are preferably and pivotally connected to the backing sections 28 via spine sections 30 for enabling the user to selectively cover or uncover the mechanism-held device 100. Exemplary backing sections 28 and exemplary covering sections 29 are perhaps most clearly seen in the plan views presented in FIGS. 11, 17, 18, 23, 25, and 27.

Figure 13:
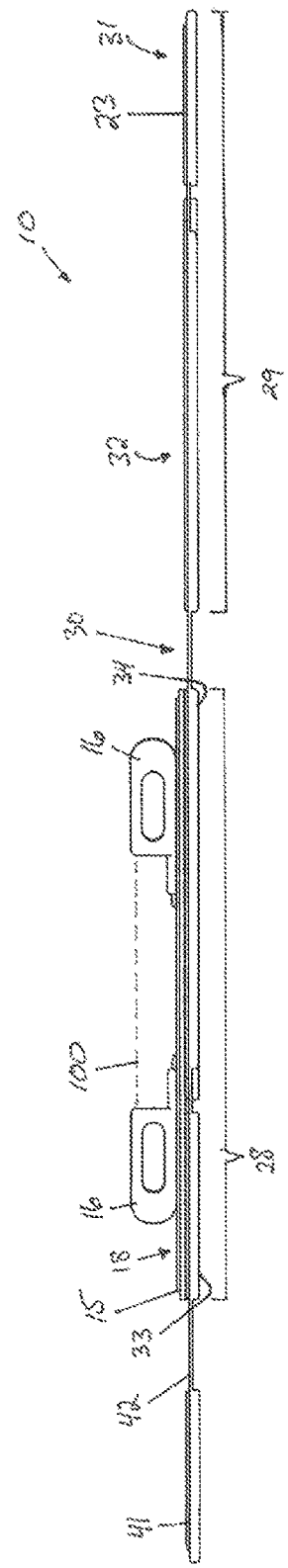
FIG. 13 is a bottom edge view of the first alternative case construction according to the present invention depicting the first alternative case construction in a fully open and flat case configuration showing certain details bottom edge details of the first alternative device-retention mechanism in combination with the first alternative multi-section jacket with a phantom electronic device retained by the first alternative device-retention mechanism.
Figure 40:
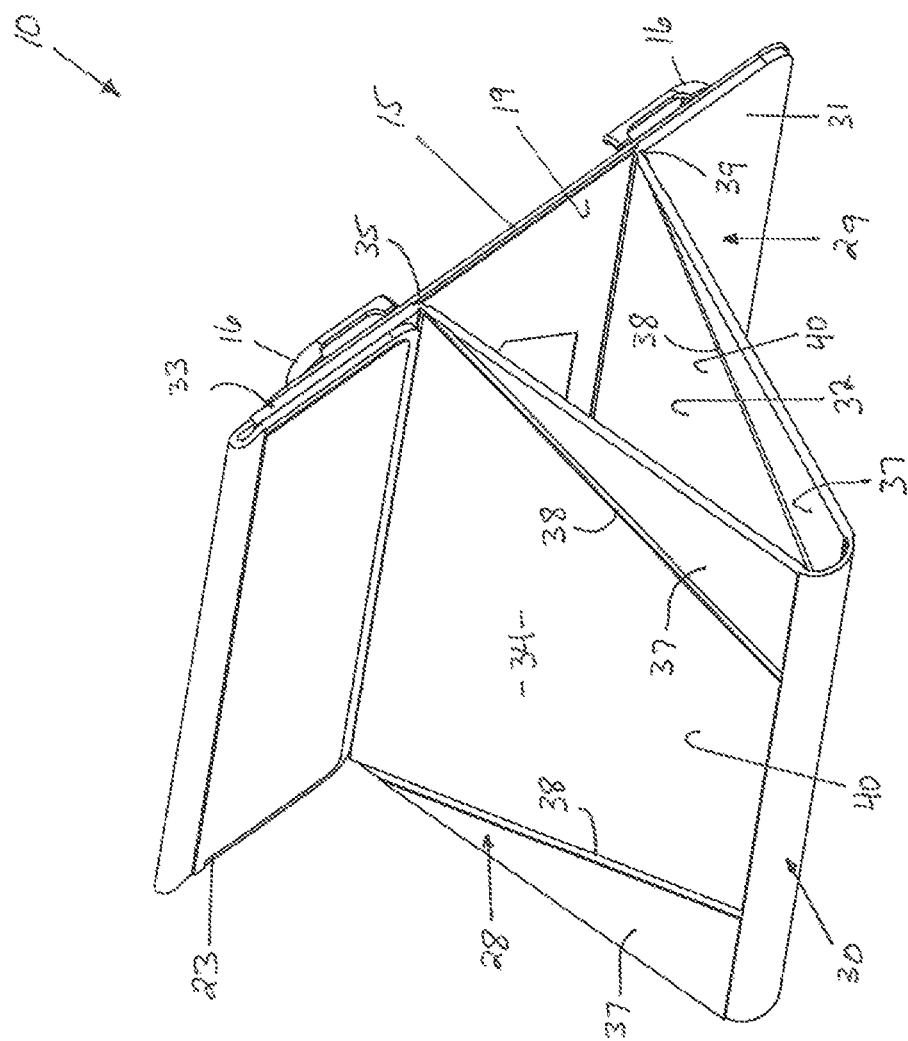
FIG. 40 is a third posterior perspective view of the first alternative case construction according to the present invention in the second select case orientation or condition of use, namely, an angled portrait orientation for the anterior portion of the first alternative device-retention mechanism with neither of the corner fold features in an inwardly folded condition or state.
Figure 41:
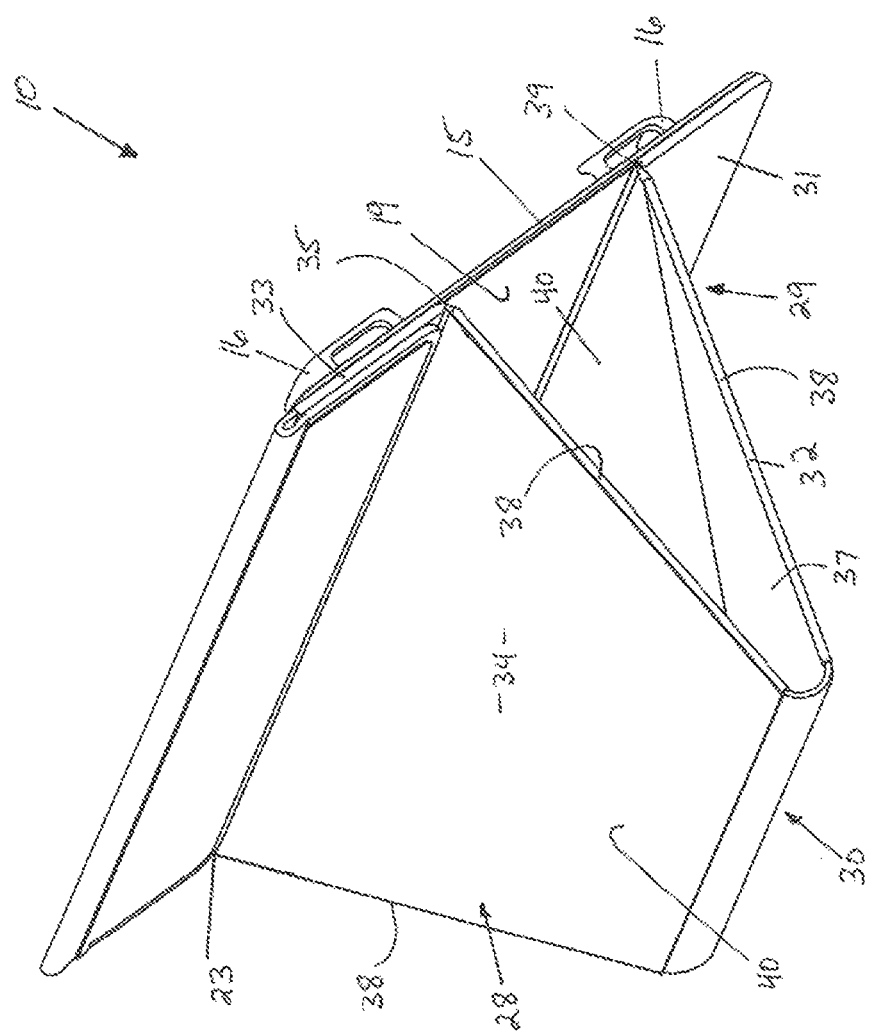
FIG. 41 is a fourth posterior perspective view of the first alternative case construction according to the present invention in the second select case orientation or condition of use, namely, an angled portrait orientation for the anterior portion of the first alternative device-retention mechanism with both of the corner fold features in an inwardly folded condition or state.

The covering sections 29 each preferably comprise a mechanism attachment section as at 31 and a mechanism support section as at 32 pivotally attached to the mechanism attachment section 31 via a pivot line or section 39. The mechanism attachment sections 31 are each removably (e.g. magnetically) attachable to the posterior jacket-opposing sections 19 of the device-holding mechanism(s) 15 and/or 21 for enabling the user to display the device-holding mechanisms 15 or 21 in select case orientations relative to the open and flat case configuration generally and comparatively shown in FIGS. 10 and 13. Angled portrait orientations are generally depicted in FIGS. 33-37, and angled landscape orientations as generally depicted in FIGS. 39-41. The mechanism support sections 32 help support the device-holding mechanisms 15 or 21 in either the portrait or landscape orientations.

Figure 16:
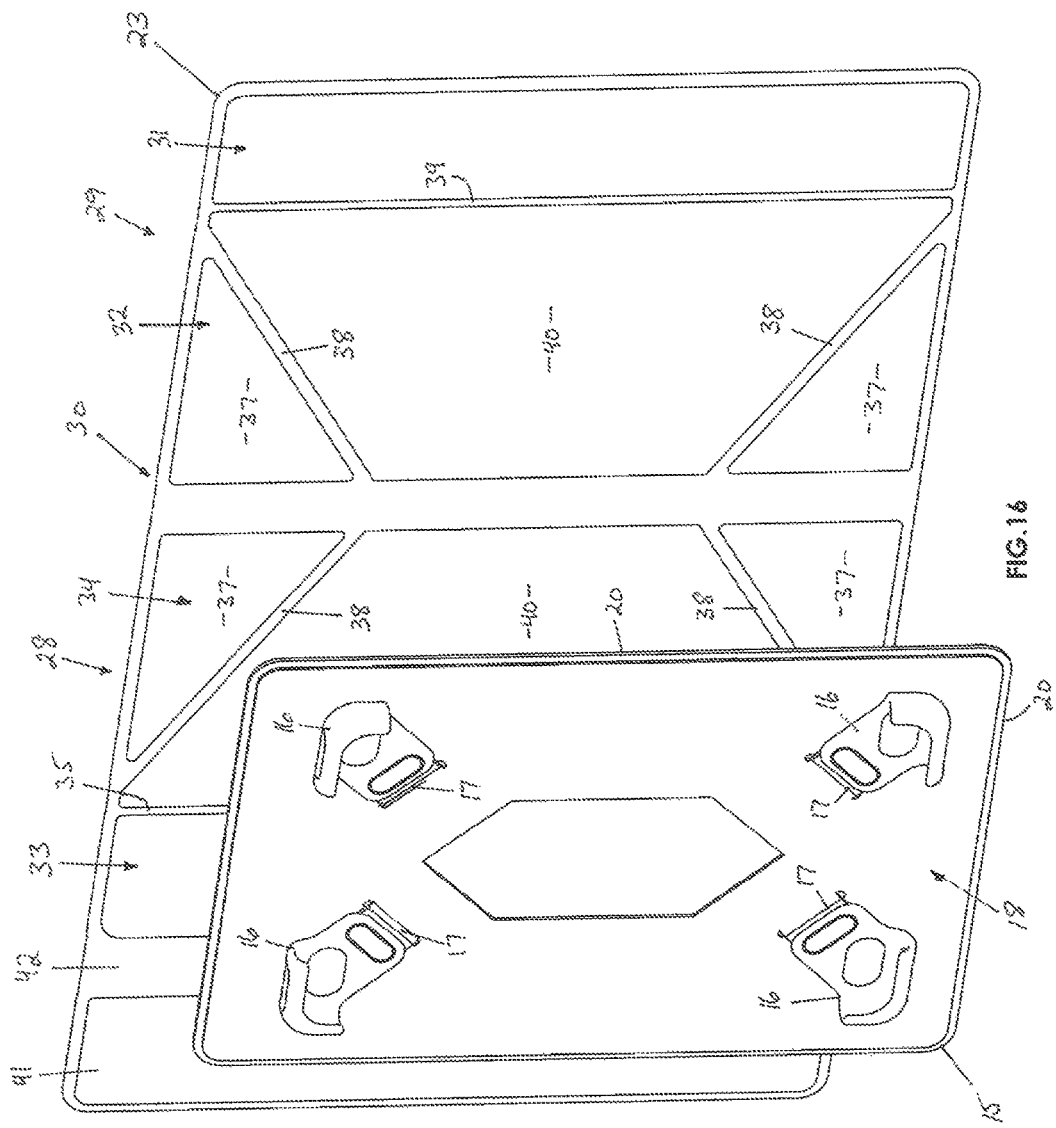
FIG. 16 is an exploded anterior perspective view of the first alternative case construction according to the present invention in a fully open and flat case configuration depicting the first alternative device-retention mechanism exploded from the first alternative multi-section jacket.
Figure 22:
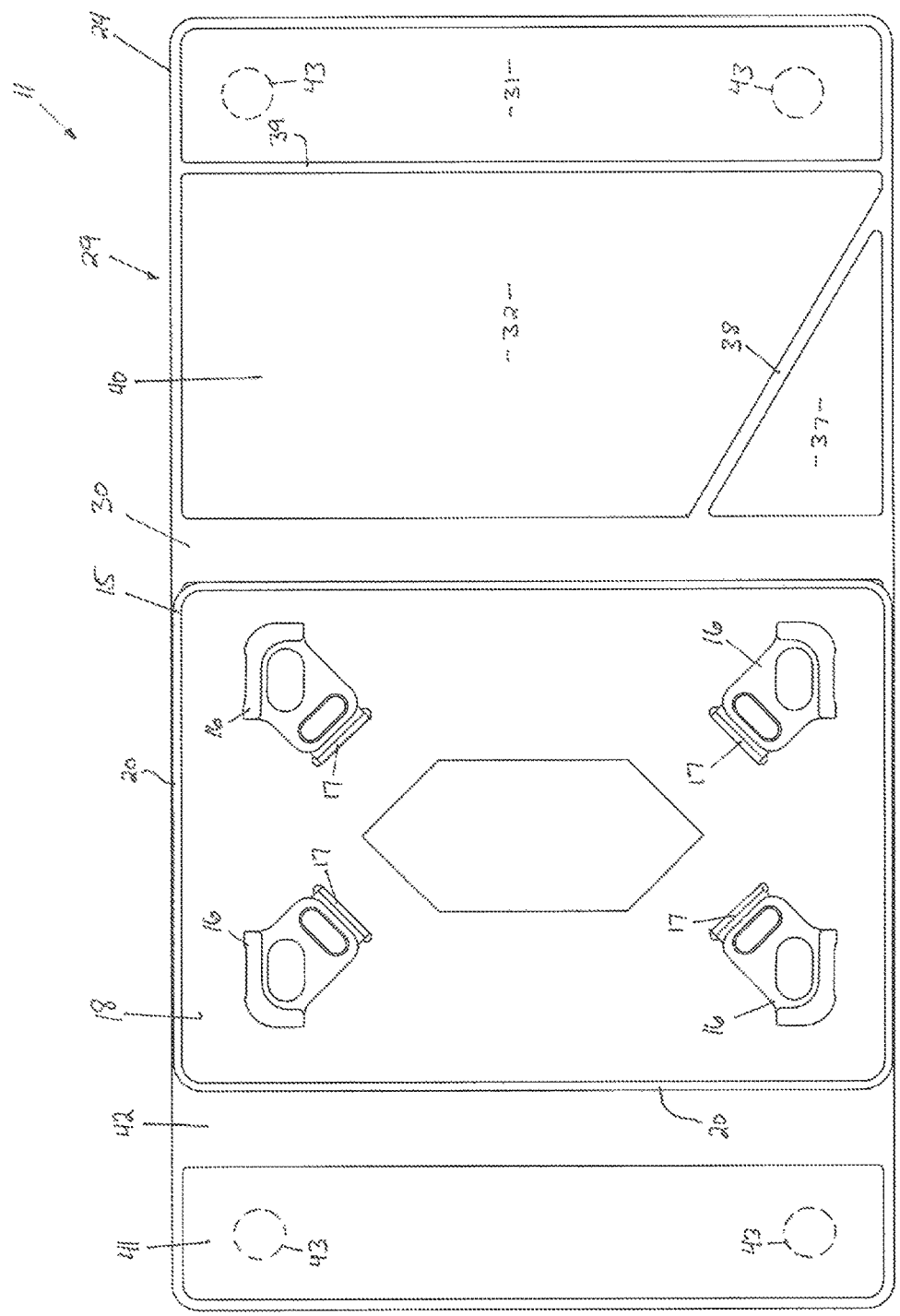
FIG. 22 is an anterior plan view of a third alternative case construction according to the present invention depicting the third alternative case construction in a fully open and flat case configuration showing the first alternative device-retention mechanism positioned atop the second alternative multi-section jacket.
Figure 23:
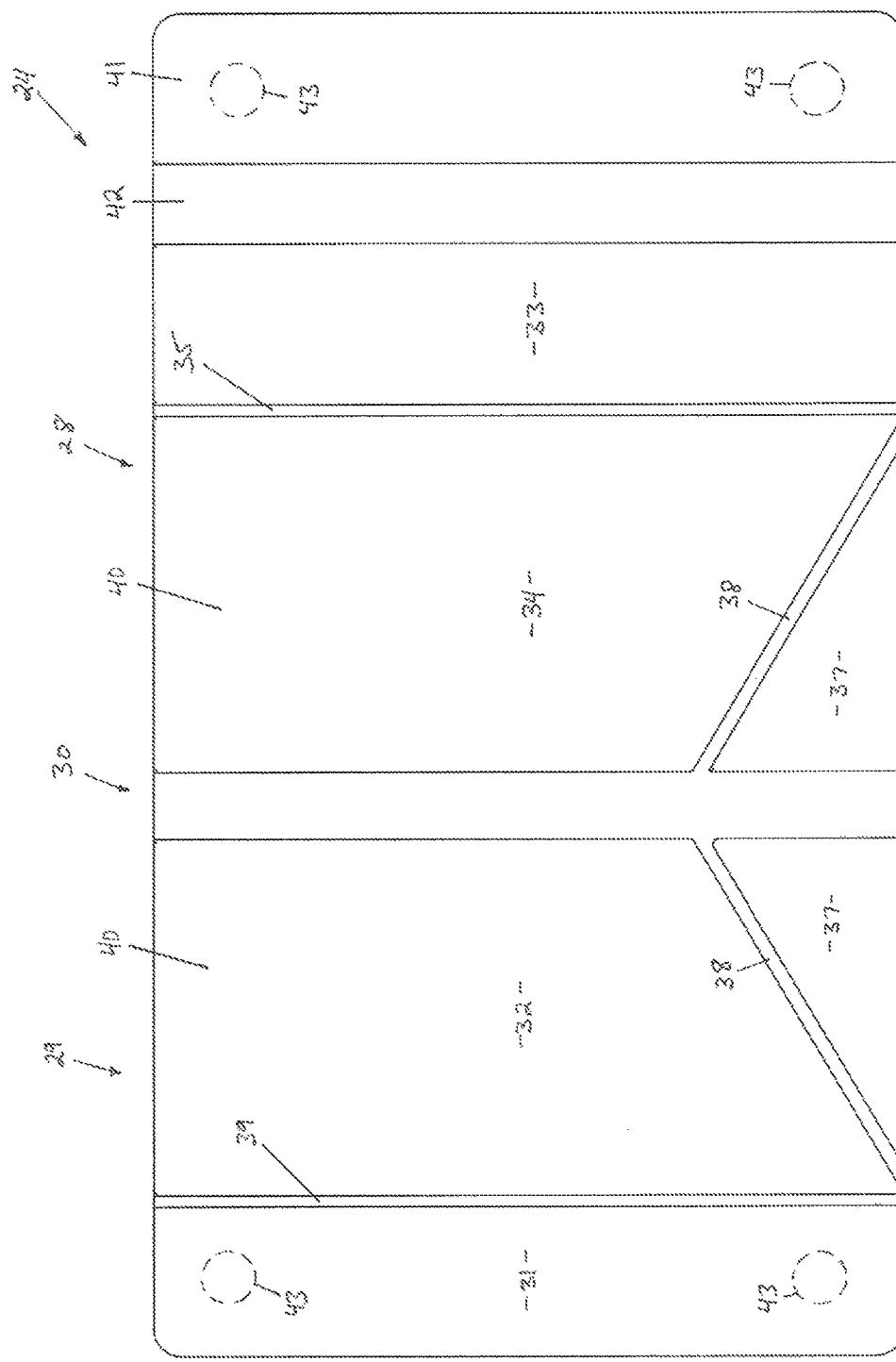
FIG. 23 is a posterior plan view of the third alternative case construction according to the present invention depicting the third alternative case construction in a fully open and flat case configuration showing certain details of the second alternative multi-section jacket.
Figure 24:
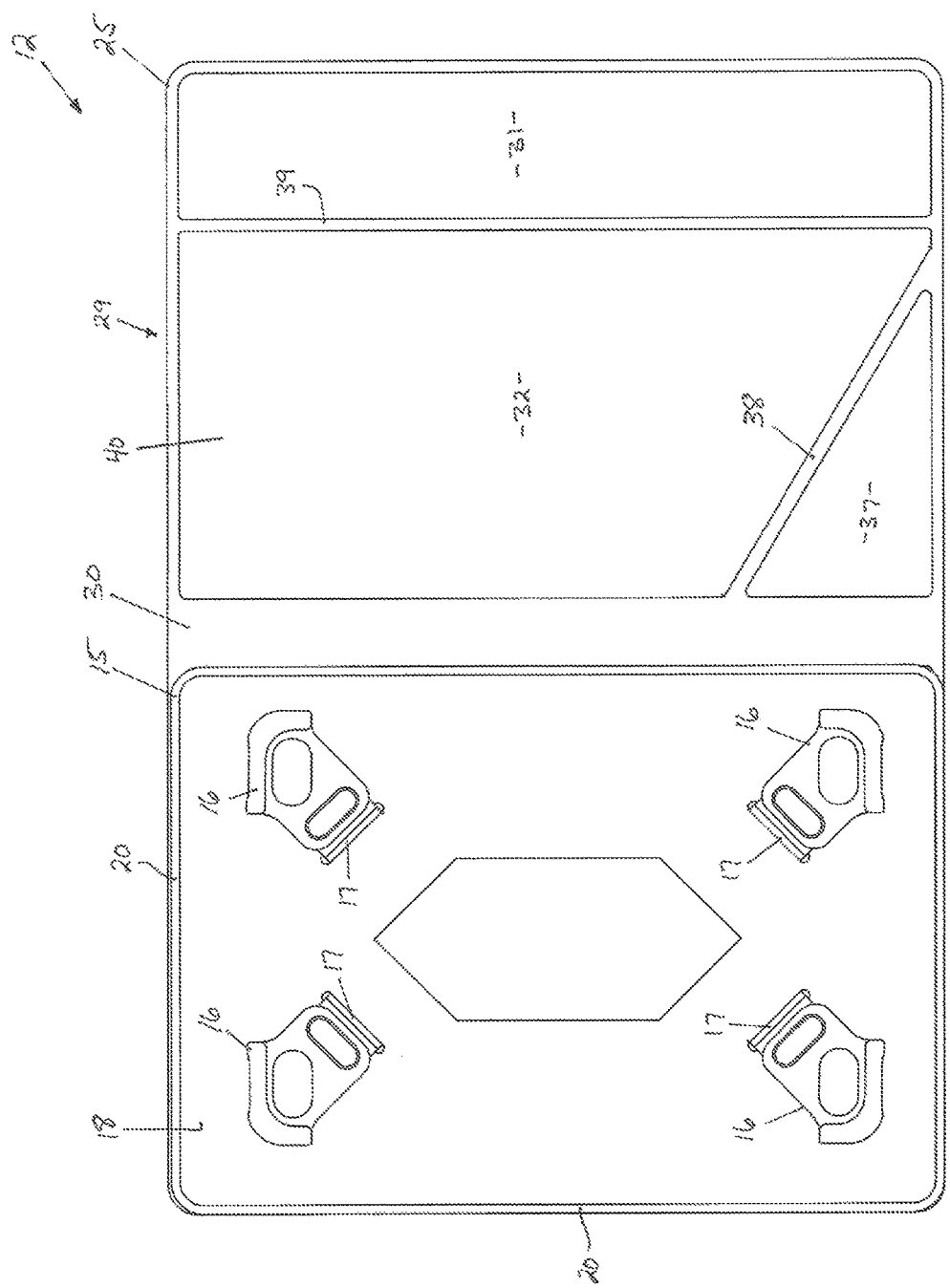
FIG. 24 is an anterior plan view of a fourth alternative case construction according to the present invention depicting the fourth alternative case construction in a fully open and flat case configuration showing the first alternative device-retention mechanism positioned atop a third alternative multi-section jacket.
Figure 25:
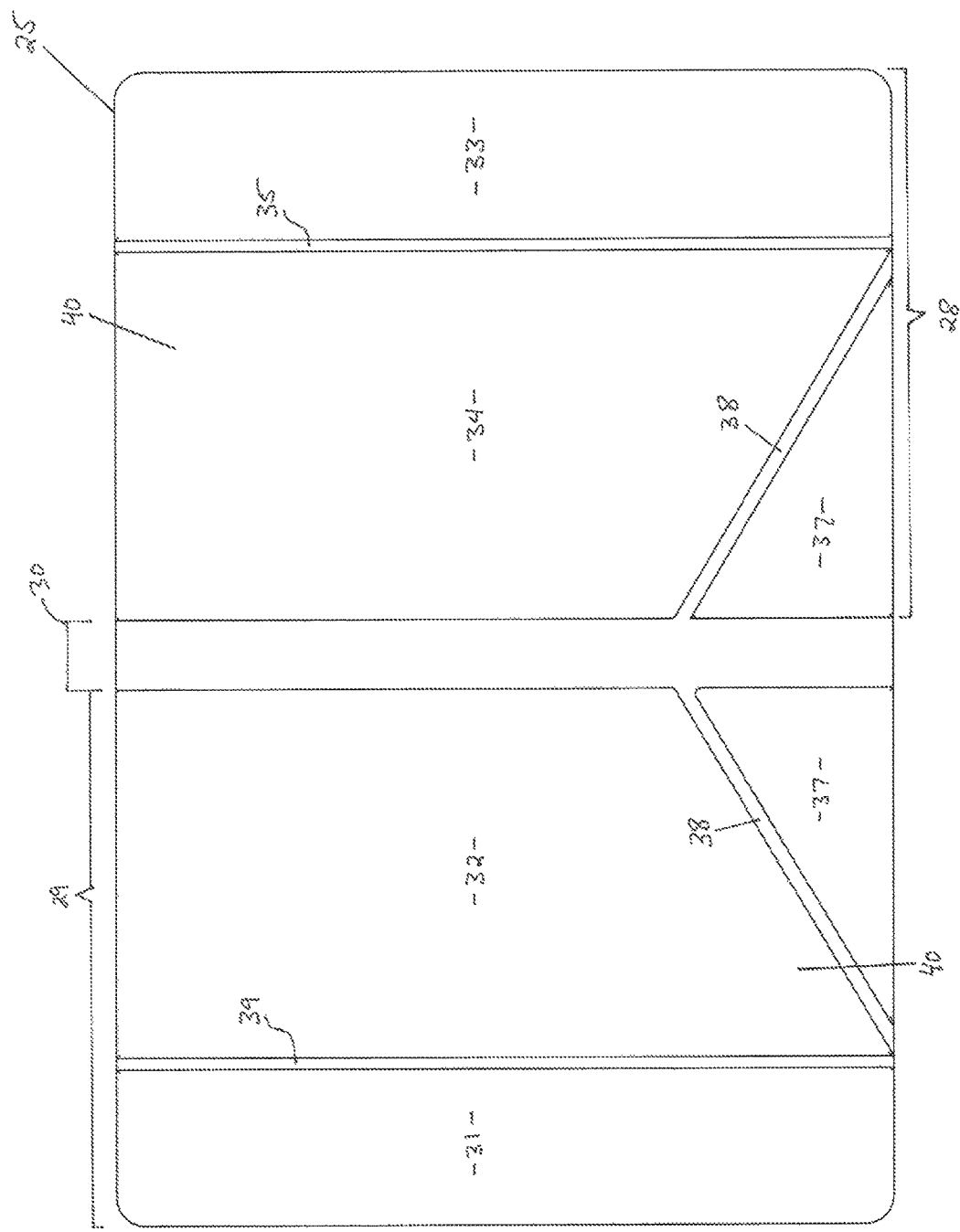
FIG. 25 is a posterior plan view of the fourth alternative case construction according to the present invention depicting the fourth alternative case construction in a fully open and flat case configuration showing certain details of the third alternative multi-section jacket.
Figure 26:
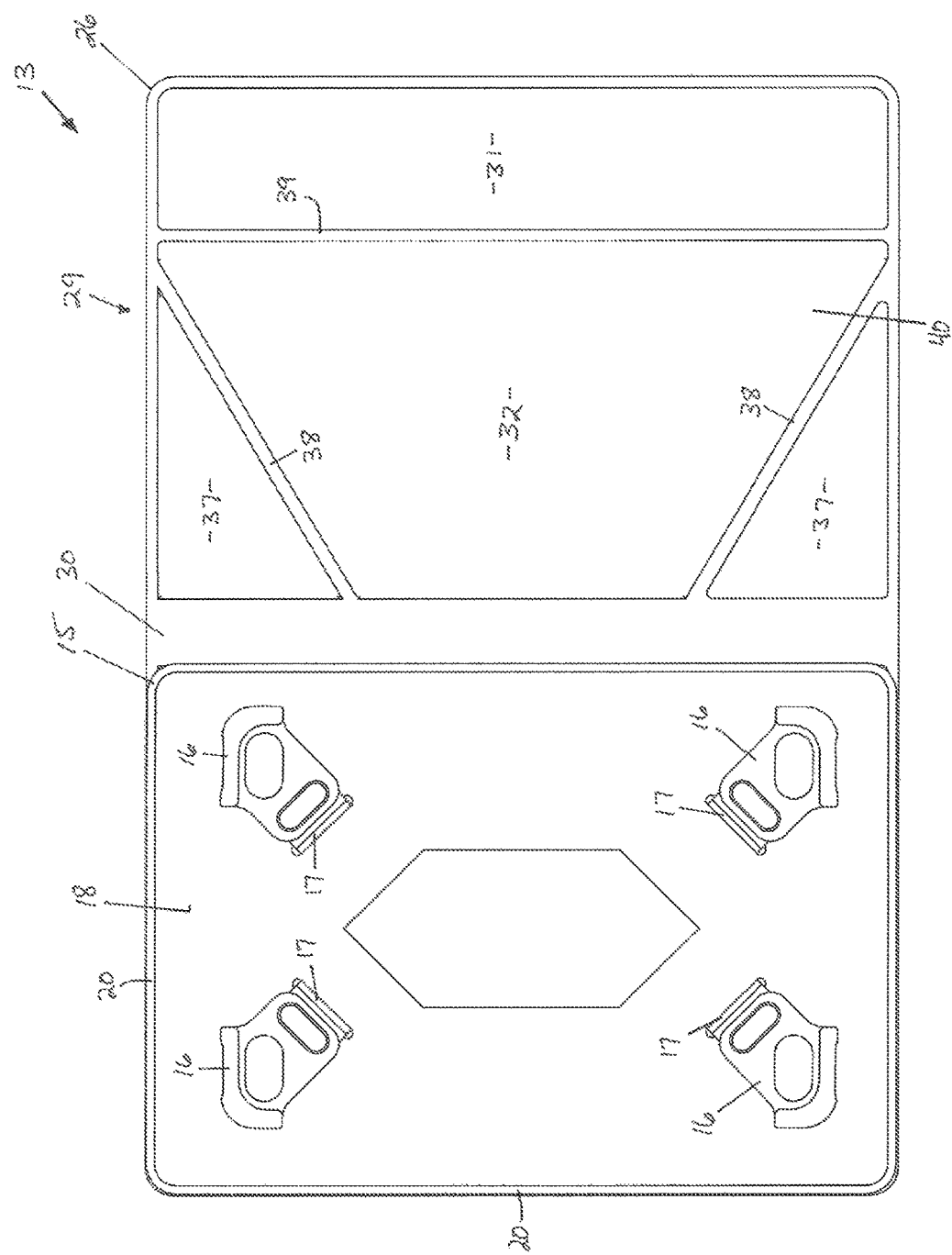
FIG. 26 is an anterior plan view of a fifth alternative case construction according to the present invention depicting the fifth alternative case construction in a fully open and flat case configuration showing the first alternative device-retention mechanism positioned atop a fourth alternative multi-section jacket.
Figure 27:
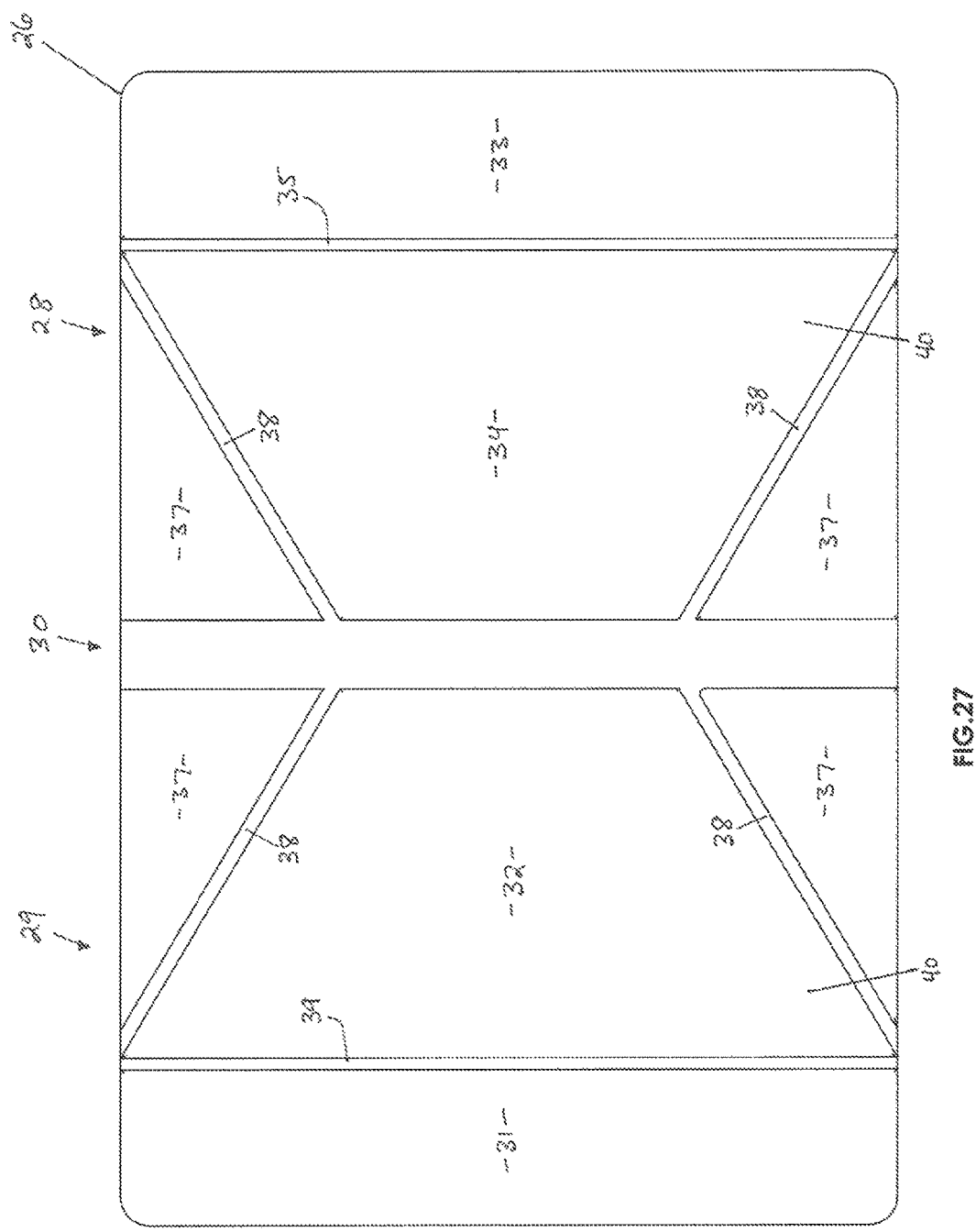
FIG. 27 is a posterior plan view of the fifth alternative case construction according to the present invention depicting the fifth alternative case construction in a fully open and flat case configuration showing certain details of the fourth alternative multi-section jacket.
Figure 30:
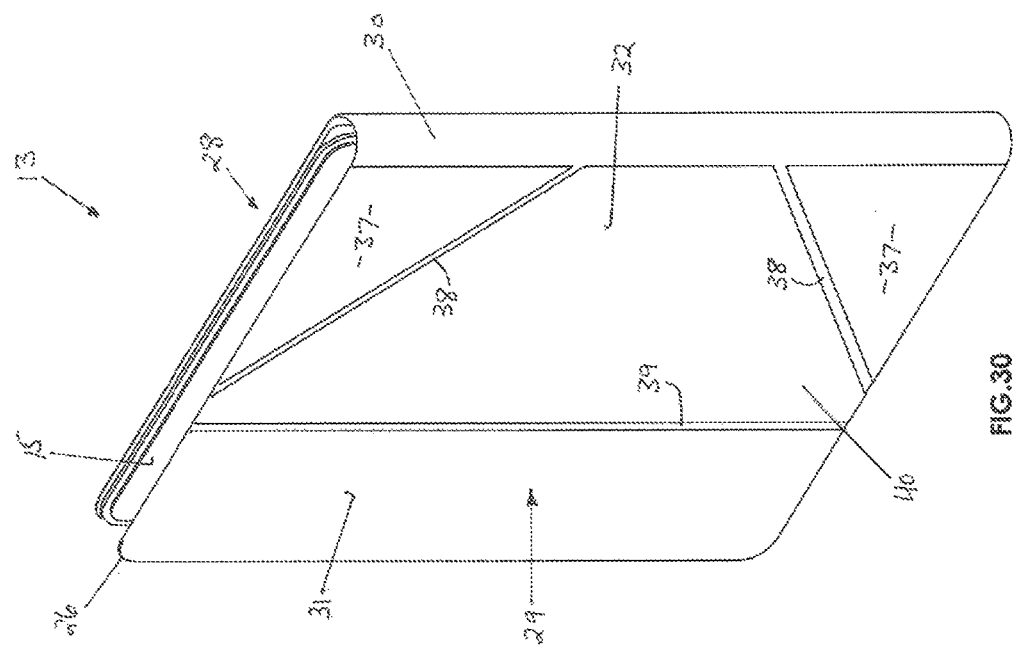
FIG. 30 is an anterior perspective view of the fifth alternative case construction according to the present invention depicting the fifth alternative case construction in the fully closed or device-jacketed or device-wrapped case configuration.
Figure 29:
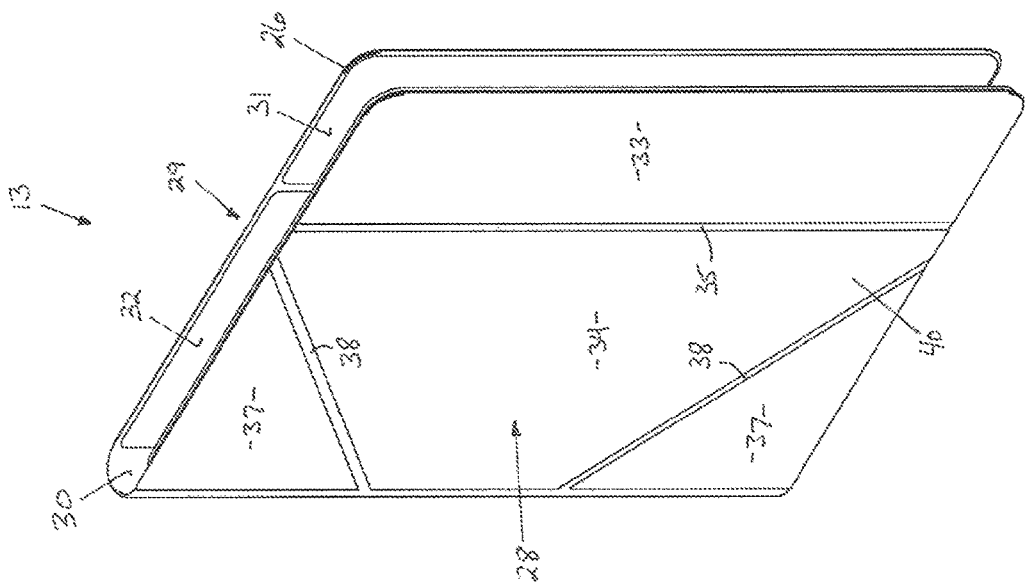
FIG. 29 is a posterior perspective view of the fifth alternative case construction according to the present invention depicting the fifth alternative case construction in a fully closed or device-jacketed or device-wrapped case configuration.

The backing sections 28 each preferably comprise a panel attachment section as at 33 and a pivot panel section as at 34. The panel attachment sections 33 may be removably (e.g. magnetically) attachable to the posterior jacket-opposing sections 19 of the device-holding mechanism(s) 15 and/or 21 or may be permanently attached to the posterior jacket-opposing sections 19 of the device-holding mechanism(s) 15 and/or 21. FIGS. 16 and 28 depict the device-retention mechanism 15 in exploded relation relative to the multi-section jackets 23 and 26 respectively. When permanently attached, either the entire panel attachment section 33 may be attached to the posterior jacket-opposing section 19 as generally depicted in FIG. 39, or the pivot line or section 35 may be attached as at hidden/broken attachment line or seam 36 to the posterior jacket-opposing section 19 as generally depicted in FIG. 39A. This latter attachment mechanism enables the user to fold down the section 33 about the pivot line 35 for enabling or supporting edge functionality of the electronic device 100 exemplified by camera lens 109.

The backing sections 28 and covering sections 29 each preferably further comprise at least one pair of spine-opposed foldable portions as at 37. Referencing FIGS. 10A, 22, 23, 24, and 25, it will be seen that multi-section jackets 24 and 25 each preferably comprise one pair of spine-opposed foldable portions 37 whereas multi-section jackets 23, 26, and 27 each preferably comprise two longitudinally-spaced or upper end/lower end-opposed pairs of foldable portions 37. The foldable portions within a pair of spine-opposed foldable portions 37 are simultaneously foldable inwardly about pivot lines 38 in cooperation with the similarly foldable or pivotal spine section 30 for enabling the user to display the device-holding mechanisms 15 or 21 in yet further angled case orientations as illustratively exemplified in FIGS. 34-37.

Figure 33:
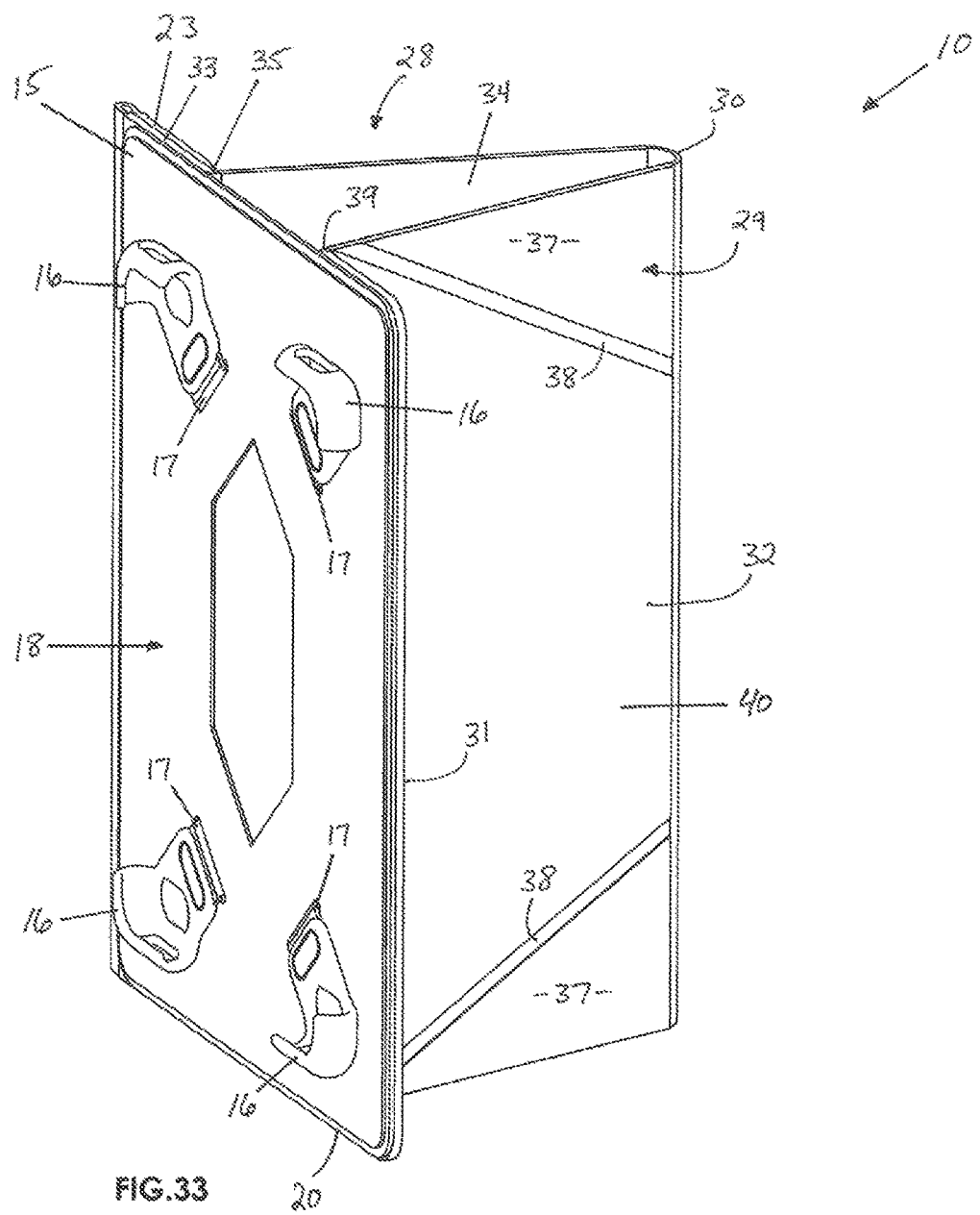
FIG. 33 is a first anterior perspective view of the first alternative case construction according to the present invention in a first select case orientation or condition of use, namely, a vertical portrait orientation for the anterior portion of the first alternative device-retention mechanism.

Referencing FIG. 33, the reader will there consider a first angled case orientation for displaying the anterior device-receiving section 18. FIG. 33 depicts a vertical portrait orientation or a 90-degree angled case orientation relative to the open and flat (i.e. horizontal) case configuration, which open and flat configuration is believed to be the most basic open case configuration for displaying the anterior device-receiving section 18. The reader will note from an inspection of FIG. 33 that the backing section 28 and covering section 29 in combination with the device-retention mechanism 15 form a generally Δ-shaped tower structure having a Δ-shaped footprint whereby the mechanism support section 32 and pivot panel section 34 together provide an angled trunk portion of the Δ-shape footprint and the mechanism attachment section 31 and panel attachment section 33 are coplanar for forming attachment feet 45 at the top portion of the Δ-shaped footprint in combination with the substantially planar device-retention structure 15. The case configuration depicted in FIG. 33 is believed to be the most basic (vertical) portrait orientation.

Figure 38:
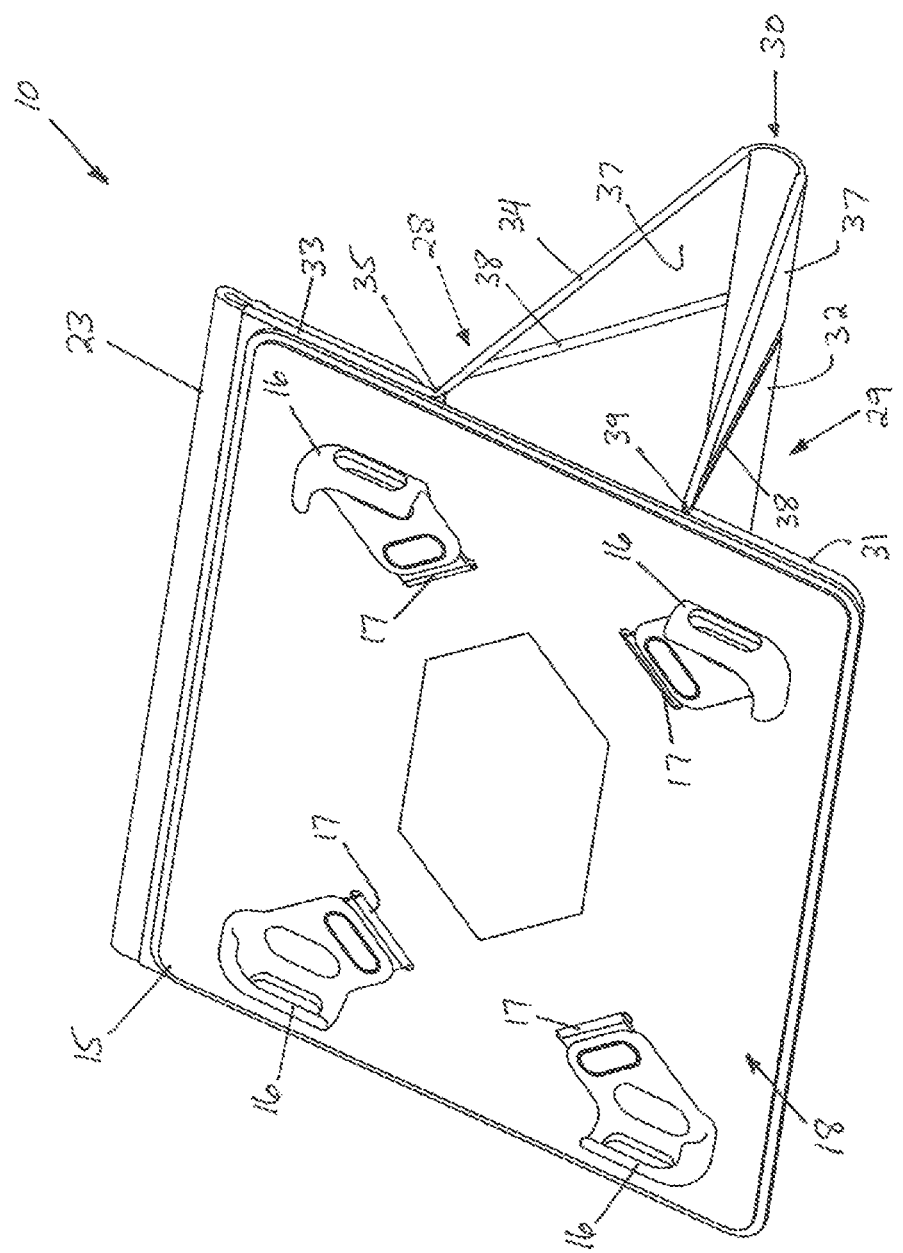
FIG. 38 is a fourth anterior perspective view of the first alternative case construction according to the present invention in a fourth select case orientation or condition of use, namely, an angled landscape orientation for the anterior portion of the first alternative device-retention mechanism with both jacket-to-mechanism attachment feet attached to the posterior jacket-opposing section of the first alternative device-retention mechanism.

Referencing FIG. 38, the reader will there consider a basic landscape orientation whereby the case configuration, as otherwise configured in FIG. 33, is re-oriented into a landscape orientation. The angled case orientation depicted in FIG. 38 shows that the case construction 10 rests upon apex edging at the junction site of the mechanism attachment section 31 and a portion of the spine section 30. When the case construction according to the present invention is in a landscape orientation, it is believed that a most basic orientation is generally depicted in FIG. 39 whereby the mechanism attachment section 31 is removed from the posterior jacket-opposing section 19 and pivoted into a coplanar relationship with mechanism support section 32 about pivot line 39. Edging 20 of the device-retention mechanism 15 (or edging 22 of the device-retention mechanism 21) may thus rest upon inner jacket surfacing of the covering section 29.

Figure 34:
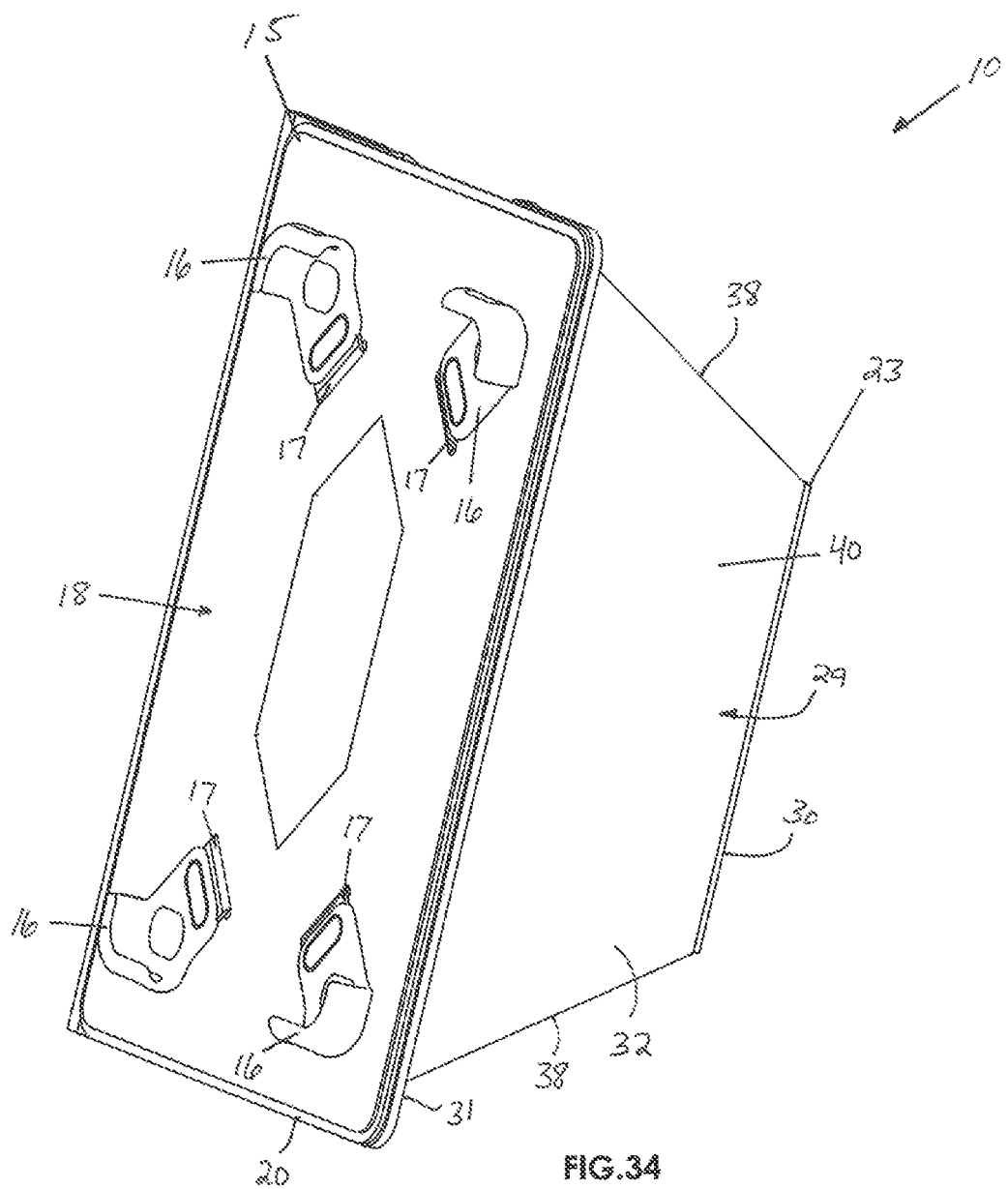
FIG. 34 is a second anterior perspective view of the first alternative case construction according to the present invention in a second select case orientation or condition of use, namely, an angled portrait orientation for the anterior portion of the first alternative device-retention mechanism with both upper and lower corner fold features in an inwardly folded condition or state.
Figure 35:
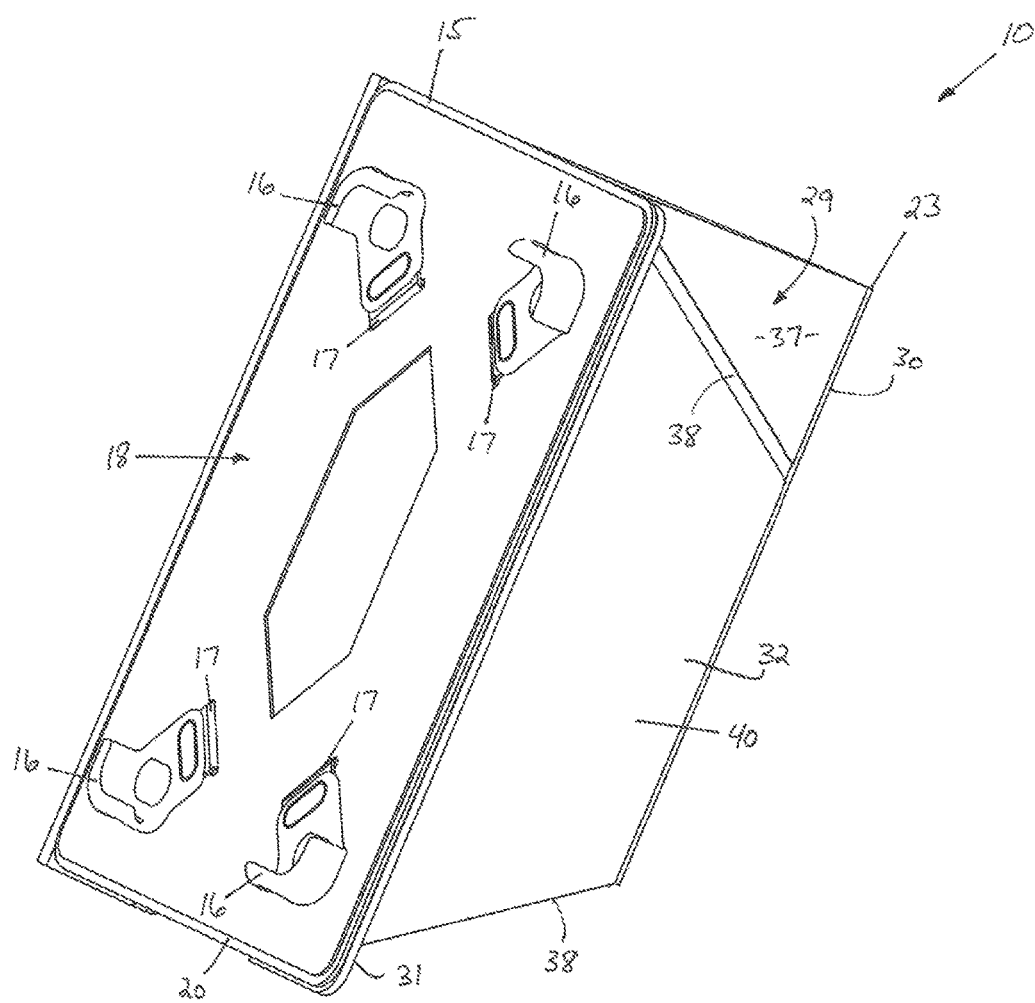
FIG. 35 is a third anterior perspective view of the first alternative case construction according to the present invention in a third select case orientation or condition of use, namely, an angled portrait orientation for the anterior portion of the first alternative device-retention mechanism with only the lower corner fold feature in an inwardly folded condition or state.
Figure 36:
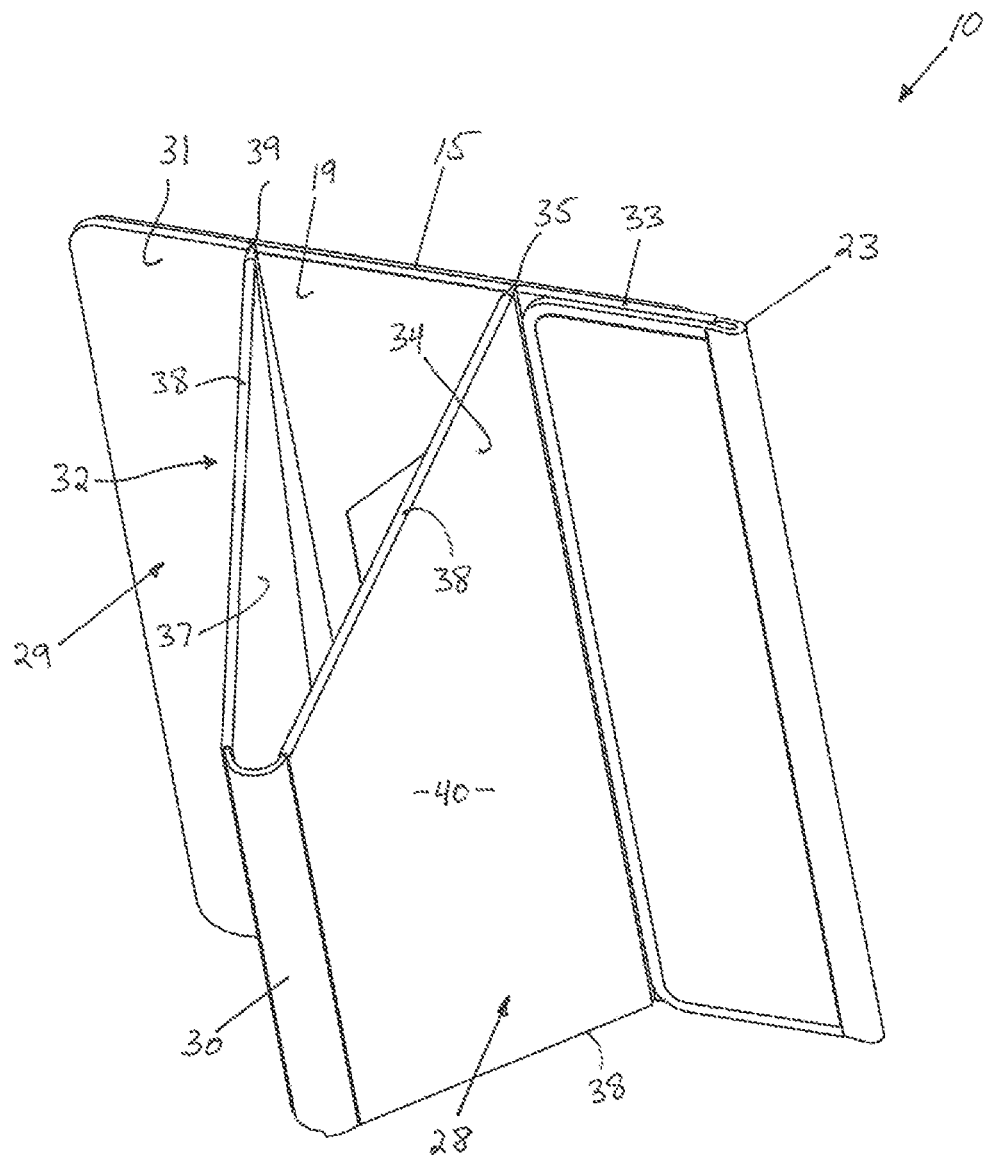
FIG. 36 is a first posterior perspective view of the first alternative case construction according to the present invention in the second select case orientation or condition of use, namely, an angled portrait orientation for the anterior portion of the first alternative device-retention mechanism with both upper and lower corner fold features in an inwardly folded condition or state.
Figure 37:
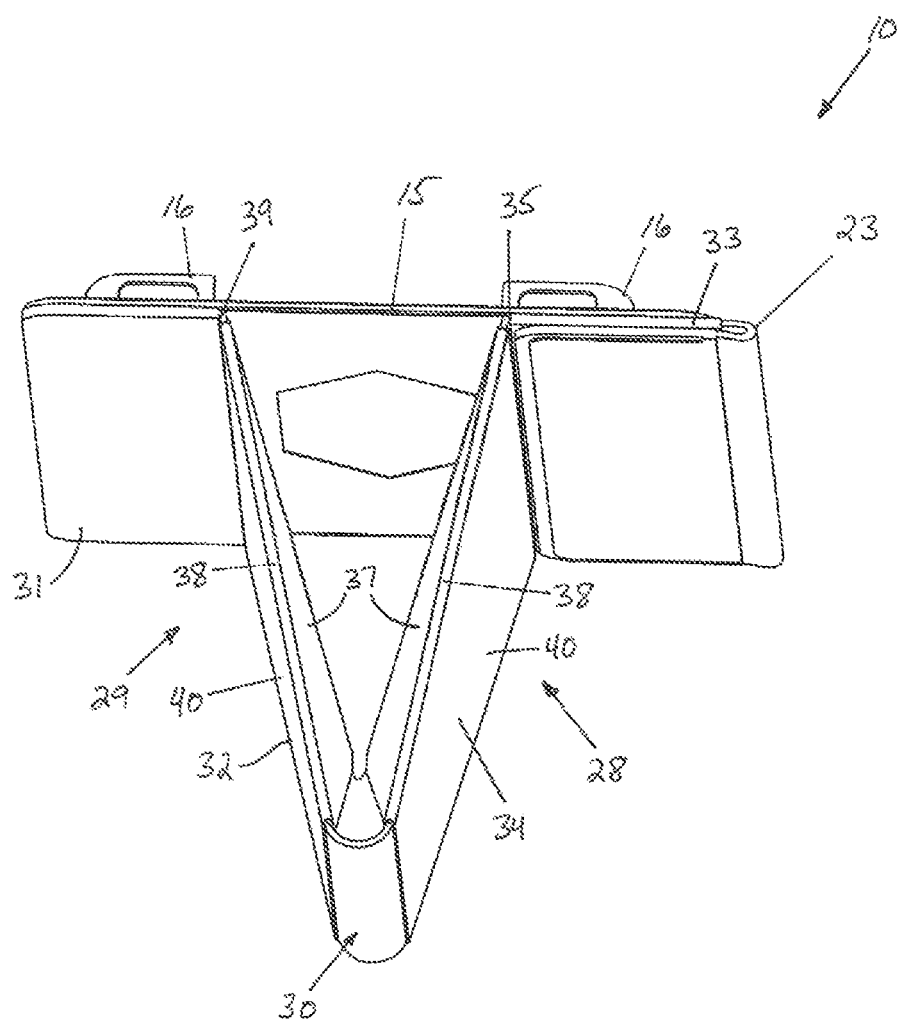
FIG. 37 is a second posterior perspective view of the first alternative case construction according to the present invention in the second select case orientation or condition of use, namely, an angled portrait orientation for the anterior portion of the first alternative device-retention mechanism with both upper and lower corner fold features in an inwardly folded condition or state.

Comparatively referencing FIG. 34 versus FIG. 35, the reader will there consider certain select implementations of foldable sections 37. In FIG. 34, both pairs of foldable portions 37 have been folded inwardly relative to the mechanism support section 32 and pivot panel section 34. This enables the user to angle the portrait orientation into an obliquely angled case orientation (i.e. a non-vertical case orientation relative to the open and flat or horizontal case configuration). The multi-section jackets 24 and 25, having a single pair of spine-opposed foldable portions 37 enable the angled case orientation exemplified by an angled, non-vertical portrait orientation for the case construction. FIG. 35 depicts case construction 10 in the angled case orientation with only a single pair of the spine-opposed foldable portions folded inwardly relative to the mechanism support section 32 and pivot panel section 34.

If the case construction 10 depicted in FIG. 35 were to be inverted, the fully extended spine-opposed foldable portions 37, being coplanar with the central support portions 40 of the mechanism support section 32 and pivot panel section 34, the case construction 10 would be displayed in a vertically angled portrait orientation. If the case construction 10 depicted in FIG. 34 (having both pairs of spine end-opposed of foldable portions 37 folded inwardly relative to the central support portions 40 of the mechanism support section 32 and pivot panel section 34), were to be upended or inverted, the resulting angled case orientation would be substantially identical to the case orientation depicted given that the foldable portions 37 at the upper spine end and lower spine end are similarly sized and shaped or dimensioned. In this regard, it is contemplated that the foldable portions 37 at the upper spine end versus the lower spine end need not be similarly sized and shaped or dimensioned thus enabling the manufacturer to provide for alternatively angled case orientations when in portrait orientations.

Multi-section jackets 23, 24, and 27 differ from multi-section jackets 25 and 26 by including a cover overlap section 41 and a spine-opposing section 42 that pivotally attaches the cover overlap section 41 to the backing section 28. The cover overlap section 41 and spine-opposing section 42 in multi-section jacket 27 are relatively abbreviated in dimension as compared to the cover overlap section(s) 41 and a spine-opposing section(s) 42 of multi-section jackets 23 and 24. The cover overlap section(s) 41 are preferably removably (e.g. magnetically) attachable to (outer surfacing of) the mechanism attachment section(s) 31 for enabling the user to selectively and fully wrap or encase the device-retention mechanism(s) 15 or 21 within the multi-section jacket(s) 23, 24 and 27. The cover overlap sections 41 and mechanism attachment sections 31 may be equally sized and shaped or dimensioned, and in such cases, the cover overlap sections 41 conceal the mechanism attachment sections 31 when encasing the device-retention mechanisms 15 or 21 within the corresponding multi-section jackets.

The preferred means for removably attaching components or sections of the various case constructions to one another are believed to best practiced by way of embedded magnets as depicted and referenced at 43 throughout the illustrations submitted in support of these specifications. In this regard, it is contemplated that the cover overlap sections 41, the mechanism attachment sections 31, and at least those portions of the posterior jacket-opposing sections 19 of the device-retention mechanisms 15 and 21 that oppose the mechanism attachment sections 31 may be preferably outfitted with embedded magnets 43 for enabling the user to removably attach opposed structures to one another. In the case of device-retention mechanisms that are removable from the multi-section jackets, it is further contemplated that the panel attachment sections 33 and corresponding posterior jacket-opposing sections 19 of the device-retention mechanisms 15 and 21 that oppose the panel attachment sections 33 may be preferably outfitted with embedded magnets for enabling the user to removably attach opposed structures to one another. These optional embedded magnets 44 are referenced with concentric broken lining in FIGS. 17 and 21.

While the above descriptions contain much specificity, this specificity should not be construed as limitations on the scope of the invention, but rather as an exemplification of the invention. The basic invention may be said to essentially teach or disclose a case construction for selectively encasing or displaying an electronic device such as a smart phone or tablet computer. The case constructions according to the present invention may all be said to preferably and essentially include a device-retention mechanism as variously exemplified at mechanisms 15 and 21; and a multi-section jacket as various exemplified at jackets 23, 24, 25, 26, and 27.

The device-retention mechanisms according to the present invention basically function to removably retain an electronic device such as a smart phone or tablet type computer. The device-retention mechanisms preferably and essentially all include an anterior device-retaining section or a frontal device-display portion as at 18 and a posterior jacket-opposing section or a back portion as at 19. The device-retention mechanism may either be permanently attached or removably attached to its corresponding multi-section jacket. When removably attachable, it is contemplated that the posterior jacket-opposing section may be outfitted with certain magnetic means for attaching the posterior jacket-opposing section to similarly outfitted portions of the corresponding multi-section jacket.

The multi-section jackets according to the present invention are each believed to preferably and essentially comprise or include a mechanism-backing section as at 28, a spine section as at 30, and a mechanism-covering section as at 29. The mechanism-backing sections 28 are preferably sized and shaped to dimensionally cover the posterior jacket-opposing section 19 and the mechanism-covering sections 29 are preferably sized and shaped to dimensionally cover the anterior device-retaining section 18. The spine section 30 pivotally connects the mechanism-covering section 29 to the mechanism-backing section 28 for enabling the user to selectively cover or uncover the device-retention mechanism 100.

The mechanism-backing section 28 and the mechanism-covering section 29 of the multi-section jacket(s) each preferably and essentially comprise or include at least one foldable portion as at 37. The foldable portions 37 are cooperatively foldable at or about the similarly foldable or pivotal spine section 30 while the mechanism attachment sections 31 of the multi-section jackets attach to the posterior jacket-opposing section 19 of the device-retention mechanism for enabling the user to form a select case support footprint such as the Δ-shaped footprint earlier described for enabling the user to selectively support the case construction in a select angled orientation relative to an open and flat case configuration.

The case construction according to the present invention may preferably further comprise or include a spine-opposing section as at 42 and a cover overlap or cover flap section as at 41. The spine-opposing section 42 pivotally connects the cover overlap section 41 to the mechanism-backing section 28 and extends in a first direction relative to the device-retention mechanism. The mechanism-covering section 29 extends in a second direction opposite the first direction relative to the device-retention mechanism when in the open and flat case configuration as generally depicted in FIGS. 10 and 10A. The cover overlap section 41 is preferably removably attachable to outer surfacing of the mechanism-covering section 29 for enabling the user to selectively encase or fully wrap the device-retention mechanism within the multi-section jacket.

As prefaced above, the posterior jacket-opposing section 19 of the case construction may be preferably and permanently (e.g. adhesively or stitched) attached to a panel attachment section (i.e. section 33) of the mechanism-backing section 28. The panel attachment section 33 extends from the spine-opposing section 42 in multi-section jackets 23, 24, and 27 toward the spine section 30 and is pivotally attached (as at pivot line 35) to a pivot panel section (i.e. section 34) of the mechanism-backing section 28 extending between the panel attachment section 33 and spine section 30.

The mechanism-covering section 29 preferably comprises or includes a mechanism attachment section as at 31 and a mechanism support section 32 pivotally attached to the mechanism attachment section 31. The mechanism support section 32 extends from the pivotal or foldable spine section 30 intermediate the spine section 30 and mechanism attachment section 31. The mechanism attachment section 31 is removably attachable (e.g. via magnetic means for removable attachment) to the posterior jacket-opposing section 19 laterally opposite the panel attachment section 33 for enabling the user to selectively display the device-retention mechanism in the select angled case orientation.

The mechanism attachment section 31 and the panel attachment section 33 are preferably equally dimensioned, and the pivot panel section 34 and mechanism support section 32 are preferably equally dimensioned. The equally dimensioned respective sections enhance footprint symmetry of the case construction for stabilizing the case construction when in the select angled case orientation. In this regard, it will be seen that the multi-section jackets according to the present invention all preferably comprise three parallel primary pivot axes, namely a (spine) pivot axis extending through the spine section 30 as at 103; a cover pivot axis 104 extending through the pivot line 39 of the covering section 29; and a back pivot axis 105 extending through the pivot line 35 of the backing section 28.

The three pivot axes 103, 104, and 105 thus enable a planar or flat multi-section jacket to be folded into a Λ shape (as at 110) with the jacket-to-mechanism attachment feet 45 of the Λ shape 110 being the equivalent of the mechanism and panel attachment sections 31 and 33, and the angled jacket support sections 46 of the Λ shape being the equivalent of the pivot panel and mechanism support sections 34 and 32. The substantially planar device-retention mechanism forms a solid gap-traversing base as at element 47 in FIG. 42. In other words, the gap between the jacket-to-mechanism attachment feet 45 is traversed by element 47 equivalent in structure to the substantially planar device-retention mechanism according to the present invention. Together, the Λ shape 110 of the multi-section jacket and the planar shape of the device-retention mechanism form a Δ shape footprint for supporting the case construction in the select angled case orientation.

Alternatively, the case construction may be placed into a landscape orientation such that edging 106 and the apex edging (as at 103) of the Λ shape are in contact with the support surface 107 as generally depicted in FIG. 43. The two lines extending out of the page as at 106 and 103 are parallel to one another, and thus the case construction according to the present invention may be said to be characterized by being alternatively supportable by either a Δ shaped footprint in a first series of case orientations with the Δ shaped footprint extending in a first two-dimensional support plane as generally depicted in FIG. 42, or at parallel edging extending in the two-dimensional support plane as generally depicted in FIG. 43. Referencing FIGS. 42A, 43A, and 44A, the reader will there consider simplified Cartesian coordinate type figures for diagrammatically depicting the planes in which the attendant figures extend, a first dimension being depicted and referenced at 121, a second dimension being depicted and referenced at 122, and a third dimension being depicted and referenced at 123.

The case constructions according to the present invention may thus basically function to selectively encase and displaying an electronic device. To achieve these basic functions, the case constructions according to the present invention may be said to essentially comprise or include a substantially planar device-retention mechanism as diagrammatically depicted at element 47 for removably retaining an electronic device and a multi-section jacket having sections as diagrammatically depicted at jacket-to-mechanism support feet 45 and jacket support sections 46. The multi-section jacket basically comprises a backing section, a covering section, and at least three parallel primary pivot axes as at axes 103, 104, and 105.

The covering section is pivotally connected to the backing section via spine section having a first primary pivot axis (i.e. axis 103) of the at least three parallel primary pivot axes (i.e. axes 103, 104, and 105) for enabling the user to selectively cover or uncover a mechanism-held device. The multi-section jacket is further pivotal about the three parallel pivot axes for forming a Λ-shaped support footprint. The substantially planar device-retention mechanism traverses a gap of the Λ-shaped support footprint for enabling a Δ-shaped support footprint. The Δ-shaped support footprint enables the user to alternatively display said device-retention mechanism upon either the Δ-shaped support footprint on a case support plane as generally depicted in FIG. 42 or upon parallel edging on the case support plane as generally depicted in FIG. 43.

Spine section structure associated with the first of the at least three parallel pivot axes comprises at least one secondary pivot axis as at 111 orthogonal to the primary pivot axis 103. The spine section structure associated with the first of the at least three parallel pivot axes is pivotal about the at least one secondary pivot axis 111 for enabling the user to display the device-retention mechanism in a select case orientation upon the Δ-shaped support footprint. The at least one secondary pivot axis 111 is formed, provided, or enabled by the intersection of at least two oblique pivot axes 108 associated with the pivot lines or sections 38 that uniformly intersect the at least three parallel pivot axes at a pivot axis intersection 48 as generally depicted in FIG. 44.

As earlier described, the pivot panel section 34 and the mechanism support section 32 may each preferably comprise or include at least one pair of spine-opposed foldable portions as at 37. Multi-section jackets 24 and 25 each comprise a single pair of spine-opposed foldable portions and multi-section jackets 23, 26, and 27 each comprise two (top end versus bottom end) pairs of spine-opposed foldable portions as at 37. The foldable portions within each pair of spine-opposed foldable portions 37 are simultaneously foldable inwardly (about axes 108 and 111 via the spine section 30) relative to the pivot panel section 34 and mechanism support section 32 for enabling the user to display the device-retention mechanism as at 15, 21, or 47 in the select case orientation.

When outfitted with two pairs of spine-opposed foldable portions 37 as in the case of multi-section jackets 23, 26, and 27, the user may thus upend or invert the case construction to achieve either a similar select angled case orientation or a varied select angled case orientation. If the opposed pairs of spine-opposed foldable portions are equally dimensioned, the equally dimensioned opposed pairs of spine-opposed foldable portions enhance the symmetry of the case construction when in any of the angled case orientations. If the opposed pair of spine-opposed foldable portions are differently sized and shaped, alternative display angles can be implemented by the user.

Accordingly, although the inventive various case constructions have been described by reference to a number of embodiments, it is not intended that the novel case constructions heretofore described be limited thereby, but that modifications thereof are intended to be included as falling within the broad scope and spirit of the foregoing disclosure, the following claims, and the appended drawings.

What is claimed is:

1. A case construction for selectively encasing and displaying an electronic device, the case construction comprising:
   a device-retention mechanism, the device device-retention mechanism for removably retaining the electronic device, the device-retention mechanism comprising an anterior device-retaining section and a posterior jacket-opposing section; and
   a multi-section jacket, the multi-section jacket comprising a mechanism-backing section, a spine section, a mechanism-covering section, a spine-opposing section, and a cover overlap section;
      the mechanism-backing section comprising a panel attachment section and a pivot panel section and being dimensioned to cover the posterior jacket-opposing section, the panel attachment section extending from the spine-opposing section toward the spine section and being pivotally attached to the pivot panel section extending between the panel attachment section and the spine section;
      the mechanism-covering section comprising a mechanism attachment section and a mechanism support section pivotally attached to the mechanism attachment section and being dimensioned to cover the anterior device-retaining section, the mechanism support section extending from the spine section intermediate the spine section and the mechanism attachment section, the mechanism attachment section being attachable to the posterior jacket-opposing section opposite the panel attachment section for enabling the user to selectively display the device-retention mechanism in a select case orientation;
      the spine section for pivotally connecting the mechanism-covering section to the mechanism-backing section for enabling the user to selectively cover or uncover the device-retention mechanism, the mechanism-backing section and mechanism-covering section each comprising a foldable portion, the foldable portions being cooperatively foldable at the spine section for enabling the user to form a select case support footprint, the select case support footprint for enabling the user to selectively support the case in the select case orientation;
      the mechanism attachment section and the panel attachment section being equally dimensioned, and the pivot panel section and the mechanism support section being equally dimensioned, the equally dimensioned respective sections for enhancing symmetrical stability of the case construction;
      the spine-opposing section pivotally connecting the cover overlap section to the mechanism-backing section, the cover overlap section extending in a first direction relative to the device-retention mechanism and the mechanism-covering section extending in a second direction opposite the first direction relative to the device-retention mechanism when in an open and flat case configuration, the cover overlap section being removably attachable to the mechanism-covering section for enabling the user to selectively encase the device-retention mechanism within the multi-section jacket.

2. The case construction of claim 1 wherein the pivot panel section and the mechanism support section each comprise at least one pair of spine-opposed foldable portions, the spine-opposed foldable portions being simultaneously foldable inwardly relative to the pivot panel section and the mechanism support section for enabling the user to selectively display the device-retention mechanism.

3. The case construction of claim 2 wherein the pivot panel section and the mechanism support section each comprise opposed pairs of spine-opposed foldable portions, the opposed pairs of spine-opposed foldable portions being selectively foldable inwardly relative to the pivot panel section and the mechanism support section for enabling the user to selectively invert the device-retention mechanism into at least one alternative case orientation.

4. The case construction of claim 3 wherein the opposed pairs of spine-opposed foldable portions are equally dimensioned, the equally dimensioned opposed pairs of spine-opposed foldable portions for enhancing symmetry of the case construction when in any of the case orientations.

5. The case construction of claim 4 wherein the cover overlap section and the mechanism attachment section are equally dimensioned, the cover overlap section concealing the mechanism attachment section when encasing the device-retention mechanism within the multi-section jacket.

6. A case construction for selectively encasing and displaying an electronic device, the case construction comprising:
   a device-retention mechanism for removably retaining the electronic device; and
   a multi-section jacket, the multi-section jacket comprising a backing section and a covering section, the covering section being pivotally connected to the backing section for enabling the user to selectively cover or uncover at least a portion of the device-retention mechanism, the backing and covering sections each comprising a jacket-to-mechanism attachment foot, a jacket support section, and opposed pairs of opposed foldable portions, the jacket-to-mechanism attachment feet being attachable to the device-retention mechanism, the jacket support sections extending from the jacket-to-mechanism attachment feet for enabling the user to display said device-retention mechanism in a select case orientation, the opposed pairs of opposed foldable portions being simultaneously foldable inwardly for enabling the user to display the device-retention mechanism in at least two alternative case orientations.

7. The case construction of claim 6 wherein the jacket-to-mechanism attachment feet are equally dimensioned and the jacket support sections are equally dimensioned, the equally dimensioned jacket-to-mechanism attachment feet and the equally dimensioned jacket support sections for enhancing symmetrical stability of the case construction.

8. The case construction of claim 6 wherein the opposed pairs of opposed foldable portions are equally dimensioned for enhancing symmetry of the case construction.

9. The case construction of claim 6 wherein the multi-section jacket comprises a spine-opposing section and a cover overlap section, the spine-opposing section pivotally connecting the cover overlap section to the backing section, the cover overlap section being removably attachable to the covering section for enabling the user to selectively encase the device-retention mechanism within the multi-section jacket.

10. The case construction of claim 9 wherein the cover overlap section and the mechanism attachment sections are equally dimensioned, the cover overlap section concealing the mechanism attachment section when encasing the device-retention mechanism within the multi-section jacket.

11. A case construction for selectively encasing and displaying an electronic device, the case construction comprising:
a device-retention mechanism for removably retaining the electronic device; and
a multi-section jacket, the multi-section jacket comprising a backing section, a covering section, and at least three parallel primary pivot axes, the covering section being pivotally connected to the backing section via a first of the at least three parallel primary pivot axes for enabling the user to selectively cover or uncover at least a portion of the electronic device, the multi-section jacket being pivotal about the three parallel pivot axes for forming a Λ-shaped support footprint, the device-retention mechanism for traversing a gap of the Λ-shaped support footprint for enabling a Δ-shaped support footprint, the Δ-shaped support footprint for enabling the user to alternatively display said device-retention mechanism upon either the Δ-shaped support footprint on a support surface plane or upon parallel edging on the support surface plane;
a structure associated with the first of the at least three parallel pivot axes comprising at least one secondary pivot axis orthogonal to the first of the at least three pivot axes, the structure associated with the first of the at least three parallel pivot axes being pivotal about the at least one secondary pivot axis for enabling the user to display the device-retention mechanism in a select case orientation upon the Δ-shaped support footprint.

12. The case construction of claim 11 wherein the at least one secondary pivot axis is formed by the intersection of at least two oblique pivot axes uniformly intersecting the at least three parallel pivot axes at a pivot axis intersection.

* * * * *